United States Patent
Morris, III et al.

(10) Patent No.: US 8,059,385 B2
(45) Date of Patent: Nov. 15, 2011

(54) SUBSTRATES WITH SLOTTED METALS AND RELATED METHODS

(75) Inventors: Arthur S. Morris, III, Raleigh, NC (US); Dana DeReus, Irvine, CA (US); Shawn J. Cunningham, Irvine, CA (US)

(73) Assignee: Wispry, Inc., Irvine, CA (US)

( * ) Notice: Subject to any disclaimer, the term of this patent is extended or adjusted under 35 U.S.C. 154(b) by 792 days.

(21) Appl. No.: 11/999,522

(22) Filed: Dec. 5, 2007

(65) Prior Publication Data

US 2008/0151468 A1 Jun. 26, 2008

Related U.S. Application Data

(60) Provisional application No. 60/872,913, filed on Dec. 5, 2006.

(51) Int. Cl.
*H01G 5/00* (2006.01)
*H01G 7/00* (2006.01)
*H01G 4/005* (2006.01)

(52) U.S. Cl. ........ 361/277; 361/303; 361/311; 29/25.42

(58) Field of Classification Search .................. 361/303, 361/311, 277
See application file for complete search history.

(56) References Cited

U.S. PATENT DOCUMENTS

| 5,382,831 | A | * | 1/1995 | Atakov et al. | 257/767 |
| 5,760,476 | A | * | 6/1998 | Varker et al. | 257/767 |
| 6,346,749 | B1 | * | 2/2002 | Umemura | 257/774 |
| 6,606,235 | B2 | | 8/2003 | Chua et al. | |
| 6,729,199 | B2 | | 5/2004 | Haupt et al. | |
| 6,994,672 | B2 | | 2/2006 | Fleischman et al. | |
| 7,084,724 | B2 | | 8/2006 | Cetiner et al. | |
| 7,115,969 | B1 | | 10/2006 | Patel et al. | |
| 2004/0145056 | A1 | * | 7/2004 | Gabriel et al. | 257/758 |
| 2005/0224916 | A1 | * | 10/2005 | Musalem et al. | 257/595 |

OTHER PUBLICATIONS

International Search Report and Written Opinion dated May 9, 2008 for PCT International Application No. PCT/US07/24905.
European Notice of Publication for EP 07862543.1-1234 dated Aug. 19, 2009.
First Office Action from Chinese Patent Office for Chinese Patent Application Serial No. 200780050940.X dated Sep. 9, 2010.

* cited by examiner

*Primary Examiner* — Eric Thomas
(74) *Attorney, Agent, or Firm* — Jenkins, Wilson, Taylor & Hunt, P.A.

(57) ABSTRACT

Substrates with slotted metals and related methods are provided. According to one aspect, a slotted metal attached to a substrate can include a metal patterned with slots less than or about equal to 2 microns. The slots can result in line widths that are approximately the size of a single metallurgical grain in an unpatterned layer.

24 Claims, 24 Drawing Sheets

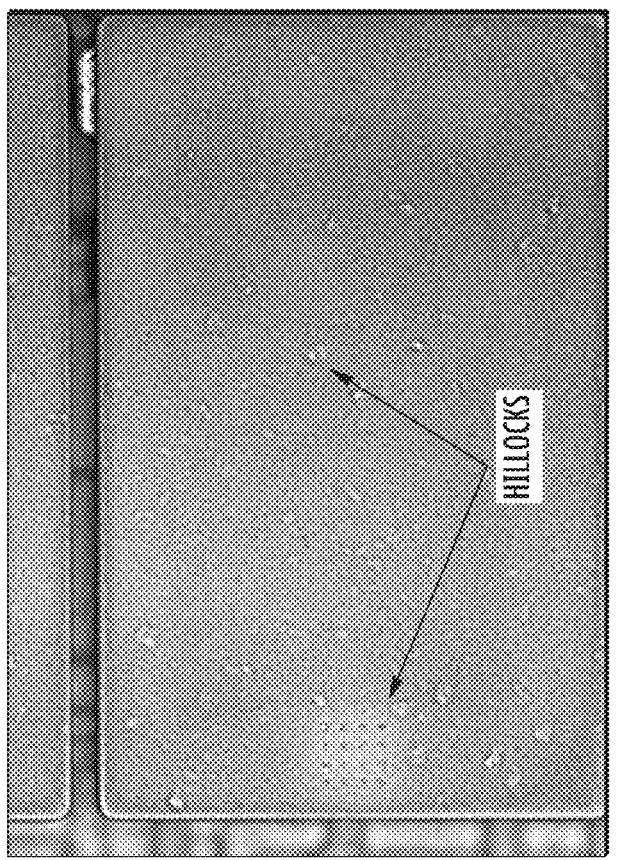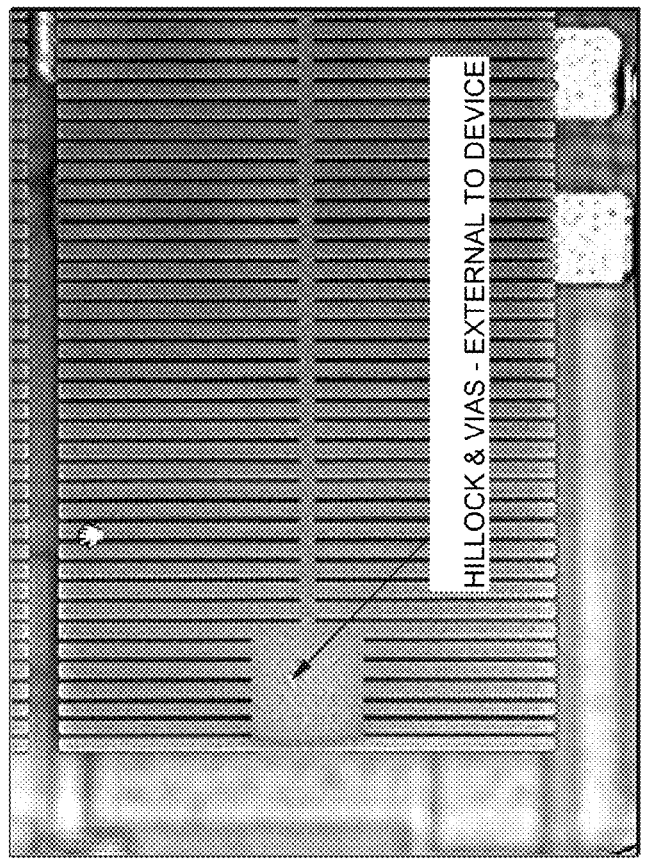
FIG. 36

SUBSTRATES WITH SLOTTED METALS AND RELATED METHODS

RELATED APPLICATIONS

The presently disclosed subject matter claims the benefit of U.S. Provisional Patent Application Ser. No. 60/872,913 filed Dec. 5, 2006; the disclosure of which is incorporated herein by reference in its entirety.

TECHNICAL FIELD

The present subject matter generally relates generally to metals attached to a substrate. More particularly, the present subject matter relates to slotted metals attached to a microelectro-mechanical systems (MEMS) substrate and related methods.

BACKGROUND

MEMS devices have a wide variety of applications and are becoming more prevalent in commercial products. MEMS devices are ideal for wireless devices because of their low power and loss along with high isolation and linearity characteristics operating in radio frequency (RF) ranges. In particular, MEMS devices are well suited for applications including cellular telephones, wireless networks, communication systems, and radar systems. In wireless devices, MEMS devices can be used as antenna switches, mode switches, transmit/receive switches, tunable filters, matching networks and the like.

MEMS devices (also known as micromachines) are generally classified into two groups according to their manufacturing techniques. One is called a bulk micromachine which is obtained by manufacturing a three-dimensional structure in such a way that a silicon wafer or a SOI (Silicon On Insulator) substrate itself is processed by etching or polishing. The other is called a surface micromachine which is obtained by manufacturing a three-dimensional structure in such a way that a thin film is stacked over a substrate such as a silicon wafer and the thin film is processed by photolithography and etching.

Surface micromachined MEMS devices can have reproducibility and reliability concerns that vary with the processes used to fabricate them. One problem is associated with the use of chemical etchants, which can lead to rough features on the surfaces of processed metal structures. These rough features on metal structures are known as hillocks. Hillocks can grow due to grain boundary slippage and compressive stress. Such growth is typically driven by thermal history at elevated temperatures during processing where the metal structures are in compression since they expand more rapidly than the substrate, insulator or other structure to which the metal structures are attached or in which the metal structures are buried. The elevated temperatures can also cause the metal grains to coalesce into larger grains. Since the metals are in compression, if grain slippage occurs, it relieves this compression by displacing outward to make space. This displacement is on the order of the grain size and can form a hillock.

The presence of hillocks on MEMS devices can prevent proper device operation. For example, hillocks can increase leakage and breakdown reliability where hillocks are field intensifiers in high voltage regions of the MEMS device. Further, hillocks create natural stress concentration points that are more likely to fragment over time, which can create destructive free particulates in the MEMS device. If a MEMS device closes on a hillock, this may cause fragmentation. Also, if the hillock is present in a gap between two element of the MEMS device, it may limit the motion and thus the function of the MEMS device. This is particularly important in capacitive RF MEMS devices where very small gaps are required for optimal function. As a result, it is highly desirable to reduce or eliminate hillocks. Accordingly, in light of these difficulties, there exists a need to improve MEMS metal structures and related formation techniques for reducing or eliminating hillock formation.

SUMMARY

It is an object of the presently disclosed subject matter to provide novel substrates with slotted metals and related methods for reducing hillock formation in MEMS devices.

An object of the presently disclosed subject matter having been stated hereinabove, and which is achieved in whole or in part by the presently disclosed subject matter, other objects will become evident as the description proceeds when taken in connection with the accompanying drawings as best described hereinbelow.

BRIEF DESCRIPTION OF THE DRAWINGS

The subject matter described herein will now be explained with reference to the accompanying drawings of which:

FIG. 36 is a top view of the surfaces of a slotted metal in accordance with the subject matter disclosed herein and an unslotted metal for the purpose of comparison.

DETAILED DESCRIPTION

Figure 1:
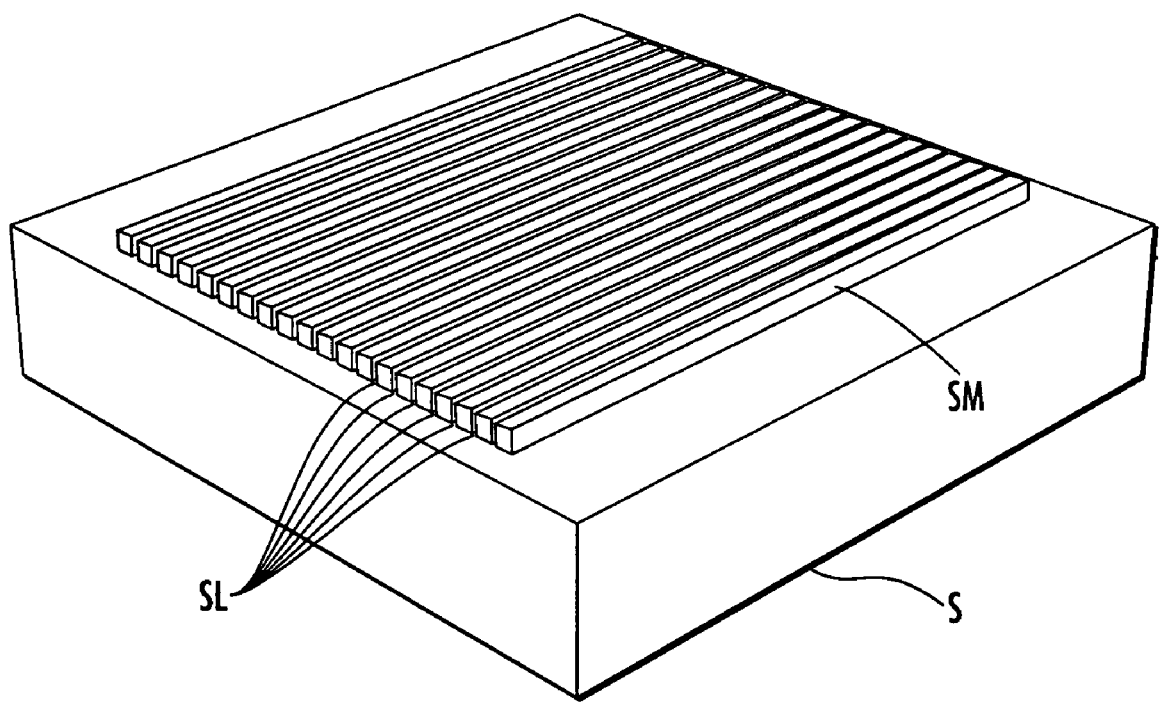
FIG. 1 is a top perspective view of a stationary, slotted metal attached to a substrate of a MEMS device according to an embodiment of the subject matter disclosed herein.

In accordance with the present disclosure, slotted metals attached to a substrate and related methods are provided. The slotted metals described herein can have particular application for use in MEMS devices, systems and methods for a variety of communication applications. The subject matter described herein can be applied for reducing or eliminating hillock formation. The slots can be formed in the metal such that an array of metallic lines are formed having a predetermined line width.

Metal slotting can reduce or eliminate hillock formation in several ways. In one way, slotting can restrict grain growth, thus limiting the size of any hillocks. Further, slots can reduce total compressive energy in metals since the total compressive energy only grows with length rather than area. In addition, the slotting allows the metal to expand some laterally, thus relieving stress. Thus, by restricting grain growth and reducing metal stresses, metal slotting in accordance with the subject matter described herein can reduce or eliminate hillock formation. Additionally, if the slotted metal is buried in another material, that material constrains the grain slippage mechanism directly. The benefits for MEMS capacitor applications include high maximum capacitance, high capacitance density, high capacitance ratio, and high capacitance change ($\Delta C$).

Slotted metal in accordance with the subject matter described herein can be patterned onto or otherwise suitably attached to a substrate. The slotted metal can include a metal patterned with slots less than or about equal to 2 microns. The slots can result in line widths that are approximately the size of a single metallurgical grain in an unpatterned layer. The slots can have uniform widths or variable widths. The line widths and spacings can be of minimum design rule compliant dimensions. The slots of the slotted metal can be oriented in the direction of a current (DC, AC, RF, or a combination thereof) applied to the MEMS device to minimize the electrical effects of the slots. RF can refer to a range between 0 Hz to about 100 GHz or above.

Further, the MEMS device may include another structure, movable or stationary with respect to the slotted metal, which has a metal component (slotted or solid). The metal components can be capacitively coupled to one another.

For purpose of the description herein, it is understood that when a component such as a layer or substrate is referred to as being "disposed on", "attached to" or "formed on" another component, that component can be directly on the other component or, alternatively, intervening components (for example, one or more buffer or transition layers, interlayers, electrodes or contacts) can also be present. Furthermore, it is understood that the terms "disposed on", "attached to" and "formed on" are used interchangeably to describe how a given component can be positioned or situated in relation to another component. Therefore, it will be understood that the terms "disposed on", "attached to" and "formed on" do not introduce any limitations relating to particular methods of material transport, deposition, or fabrication.

Contacts, interconnects, conductive vias, electrothermal components and electrodes of various metals can be formed by sputtering, CVD, evaporation or electroplating. Some metals might require an appropriate intermediate adhesion layer to prevent peeling. Examples of adhesion material often used include chromium, titanium, or an alloy such as titanium-tungsten (TiW) or titanium-nitride (TiN). Some metal combinations can require a diffusion barrier to prevent an adhesion layer from diffusing through the metal and vice versa.

Conventional lithographic techniques can be employed in accordance with fabrication, such as micromachining, of the subject matter described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to the methods of the invention as starting substrates for the fabrication of microstructures.

An alternative patterning process to etching is the lift-off process as known to those of skill in the art. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component." As used herein, the term "conductive" is generally taken to encompass both conducting and semi-conducting materials.

Embodiments of Slotted Metals on Substrates

Embodiments of slotted metals on substrates in accordance with the subject matter disclosed herein will now be described with reference to FIGS. 1-13.

FIG. 1 is a top perspective view of a stationary, slotted metal SM attached to a substrate S of a MEMS device according to an embodiment of the subject matter disclosed herein. Only slotted metal SM and substrate S of the MEMS device are shown for illustrative purposes. The MEMS device may include one or more movable components, suitable actuation components (e.g., a voltage source, actuation electrodes, and traces), signaling lines, electrical traces, RF signal lines, and/ or dielectric components for suitable operation. Exemplary MEMS devices can include a tunable capacitor, a variable capacitor, and a switchable capacitor.

Referring to FIG. 1, slotted metal SM can be patterned with slots SL to form lines with widths that are approximately the size of a single metallurgical grain in an unpatterned layer. Slots SL are shaped substantially linearly. Alternatively, the patterned slots can be shaped non-linearly, such as in a zigzag shape or a curvilinear shape. Further, the line widths can be between approximately 0.1 microns and 2 microns. Slots SL can reduce or eliminate hillock formation on metal SM during manufacture of the MEMS device. The slot widths may be of any dimension but are usually chosen as small as possible for a given micro-fabrication facility to maximize functional electrode area.

Slotted metal SM can be any suitable metallic or semi-metallic component of a MEMS device such as a contact, an interconnect, an electrode, a capacitive plate, a conductive line, and other various conductive elements of various metals including, for example, aluminum, gold, silver, copper, platinum, rhodium, rhenium, nickel or combinations thereof. Further, the MEMS device can include a movable or stationary structure having the slotted metal. Further, the slotted metal may be buried within the MEMS device structure or attached to a surface of the MEMS device structure. Exemplary MEMS devices include one of a tunable capacitor, a variable capacitor, a switchable capacitor, and a suitable MEMS device.

The slotted metal can be made of any suitable material that is prone to hillock formation. For example, the slotted metal may all or partially be formed of metal. Sputtering, chemical vapor deposition (CVD), or evaporation techniques can be used for forming the slotted metal. An electroplating process can be carried out to transport the metal material to a desired surface of the substrate. The chemical solutions used in the electroplating of various metals are generally known in the art. Some metals, such as gold, might require an appropriate intermediate adhesion layer to prevent peeling. Examples of adhesion material often used include chromium, titanium, or an alloy such as titanium-tungsten (TiW). Some metal combinations can require a diffusion barrier to prevent a chromium adhesion layer from diffusing through gold. Examples of diffusion barriers between gold, aluminum, gold, silver, copper, platinum, rhodium, rhenium, nickel, chromium, and combination thereof would include platinum or nickel.

Non-limiting examples of materials which substrate S can comprise include silicon (in single-crystal, polycrystalline, or amorphous forms), silicon oxinitride, glass, quartz, sapphire, zinc oxide, alumina, silica, or one of the various Group III-V compounds in either binary, ternary or quaternary forms (e.g., GaAs, InP, GaN, AlN, AlGaN, InGaAs, etc.) and combinations/layers thereof. If the composition of substrate S is chosen to be a conductive or semi-conductive material, a non-conductive, dielectric layer can be deposited on the top surface of substrate S, or at least on portions of the top surface where electrical contacts or conductive regions are desired.

Figure 2:
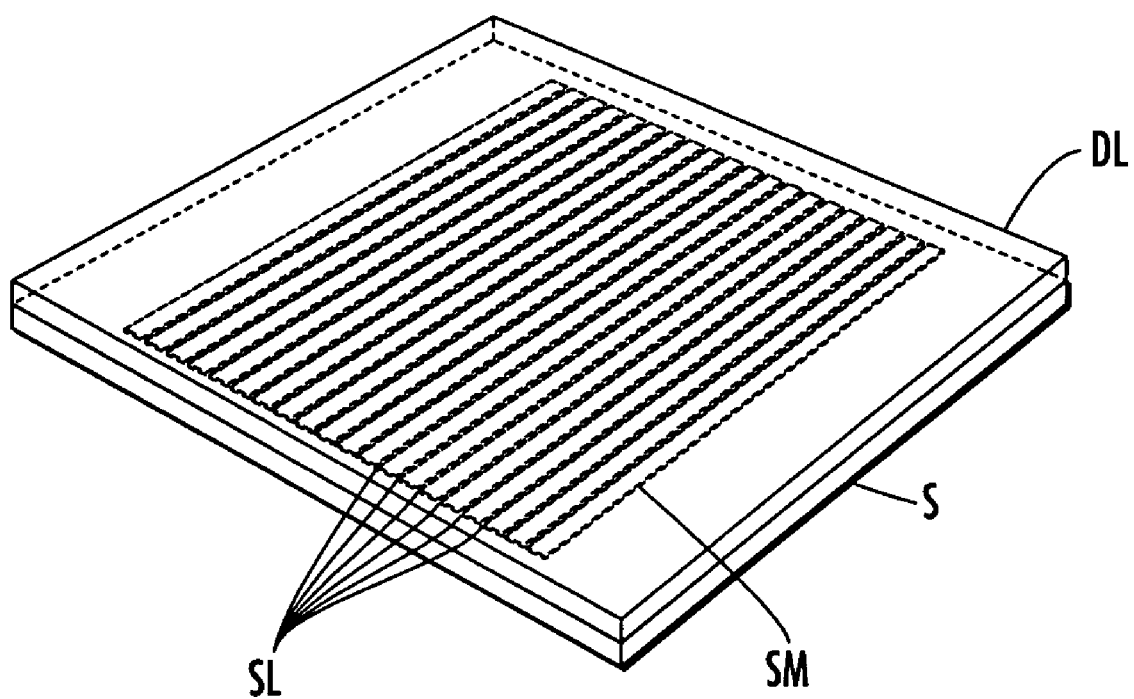
FIG. 2 is a top perspective view of slotted metal attached to substrate and having a dielectric/insulating layer deposited thereon according to an embodiment of the subject matter disclosed herein.

In another embodiment, a dielectric layer or other suitable insulating material can be deposited on slotted metal. FIG. 2 is a top perspective view of slotted metal SM attached to substrate S and having a dielectric/insulating layer DL deposited thereon according to an embodiment of the subject matter disclosed herein. Referring to FIG. 2, dielectric/insulating layer DL is deposited on slotted metal SM. Slots SL of metal SM are less than or about 2 microns for resulting in metal line widths that are approximately the size of a single metallurgical grain in an unpatterned layer. Further, slots SL can range between about 0.5 microns and 2.0 microns or any other suitable distance. Line widths can be between approximately 0.1 microns and 2 microns.

Figure 3:
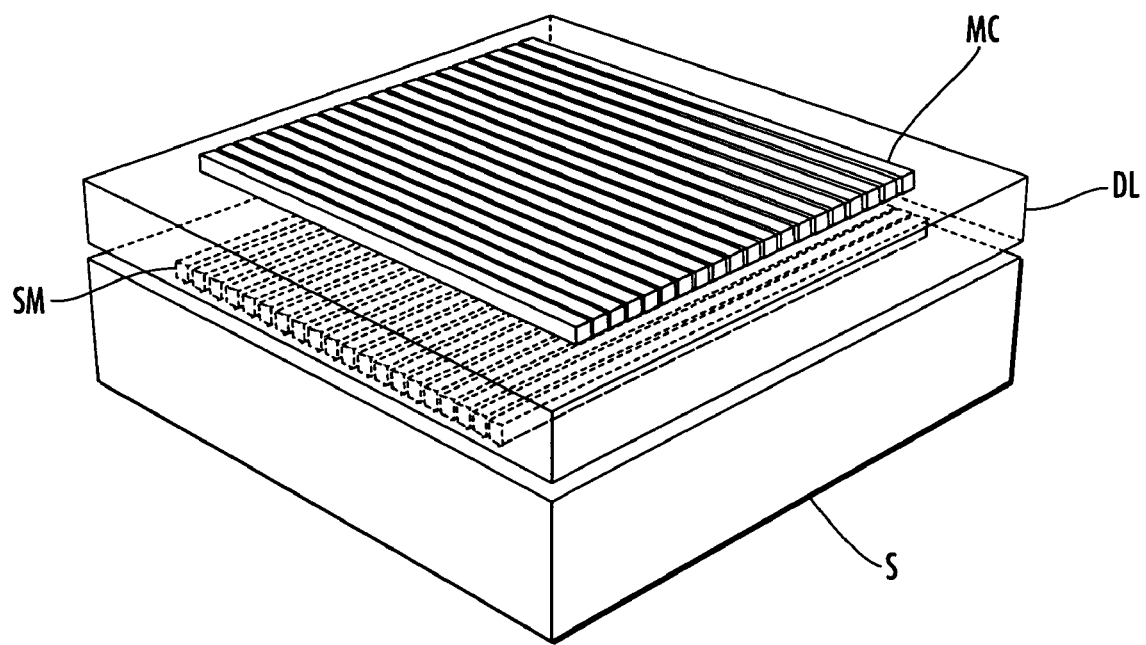
FIG. 3 is a top perspective view of a slotted metal formed on a substrate of a MEMS device and having a dielectric/insulating layer and a metal component formed thereon according to an embodiment of the subject matter disclosed herein.
Figure 4:
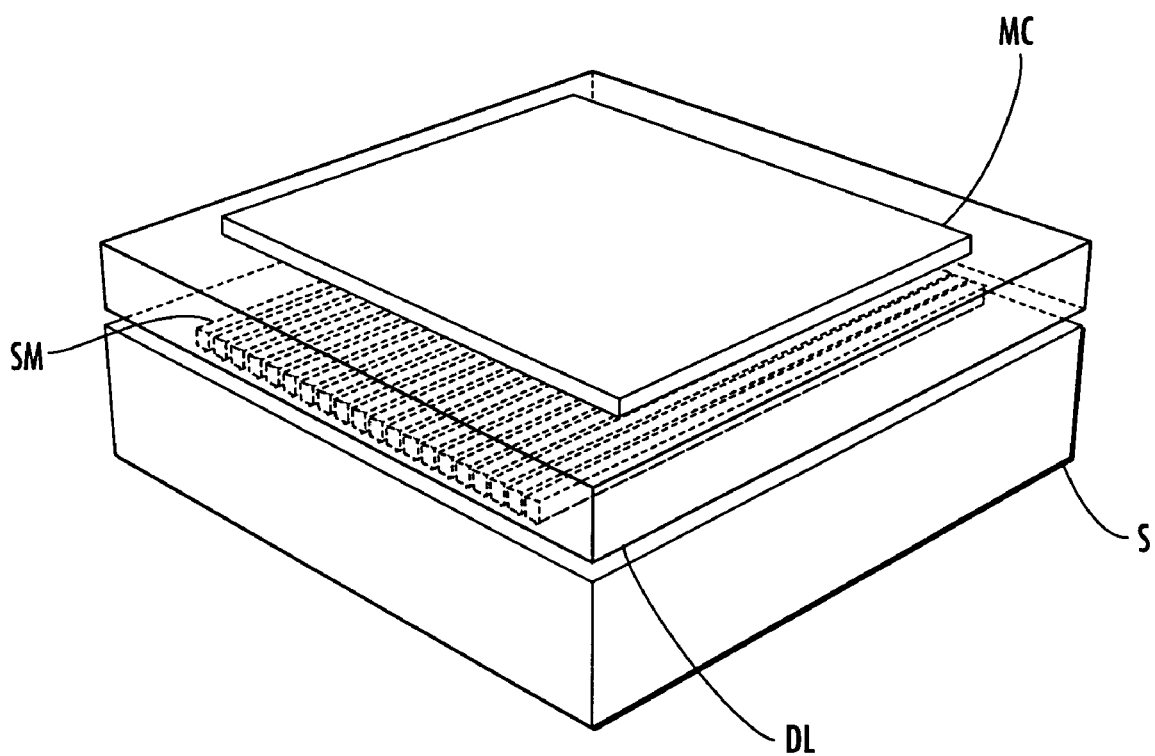
FIG. 4 is a top perspective view of a slotted metal formed on a substrate of a MEMS device and having a dielectric/insulating layer and a metal component formed thereon according to an embodiment of the subject matter disclosed herein.

In another embodiment, a second metal may be attached to a dielectric/insulating layer and a slotted metal. The second metal may be a solid metal layer or another slotted metal. The slotted metal and second metal may be either spaced from one another by the dielectric/insulating layer, another suitable layer, or an air gap. FIGS. 3 and 4 are top perspective views of slotted metal SM formed on substrate S of a MEMS device and having dielectric/insulating layer DL and a metal component MC formed thereon according to an embodiment of the subject matter disclosed herein. Referring to FIG. 3, metal component MC has slots less than or about equal to 2 microns. The resultant line widths are between approximately 0.1 microns and 2 microns. The slots of metal component MC are arranged in an array that is substantially perpendicular to the arrangement of the slots of metal SM. Alternatively, the array of slots of metal component MC and metal SM can be substantially parallel to one another or any other suitable arrangement with respect to one another. Further, the slot arrays are on planes that are substantially parallel to one another but, in the alternative, the slot arrays can be otherwise suitably arranged with respect to one another.

Slotted metal SM and metal component MC can be capacitively coupled. In one example, the MEMS device may maintain the metallic components at the same distance with respect to one another such that the capacitance is constant. Alternatively, the MEMS device may be actuated to move the metallic components with respect to one another for varying the capacitance.

Referring to FIG. 4, metal component MC is a solid metal layer. Slotted metal SM and metal component MC can be capacitively coupled. Further, the MEMS device can control the distance separating the capacitive components for maintaining a constant capacitance or controllably varying the capacitance.

In an alternative utilization of the embodiments shown in FIGS. 3 and 4, dielectric/insulating layer DL can be a sacrificial layer used for fabricating a beam structure. For example, during fabrication, slotted metal SL can be patterned on substrate S. Next, dielectric/insulating layer DL can be deposited on slotted metal SL and the top surface of substrate S. Dielectric/insulating layer DL can be deposited to conform to slotted metal SL and the top surface of substrate S. Alternatively, dielectric/insulating layer DL can be deposited such that the bottom surface of the dielectric/insulating layer attached to the top surfaces of slotted metal SL in a planarizing manner. Next, metal component MC can be deposited on the top surface of dielectric/insulating layer DL. Other suitable beam or movable structures as described in further detail hereinbelow can be attached to metal component MC. Next, dielectric/insulating layer DL can be removed as known by those of skill in the art for freeing the structural layer and metal component MC from slotted metal SL and substrate SL. With removal of the sacrificial layer of dielectric/insulating layer DL, the structural layer including metal component MC is free to move with respect to substrate S and slotted metal SM.

Figure 5:
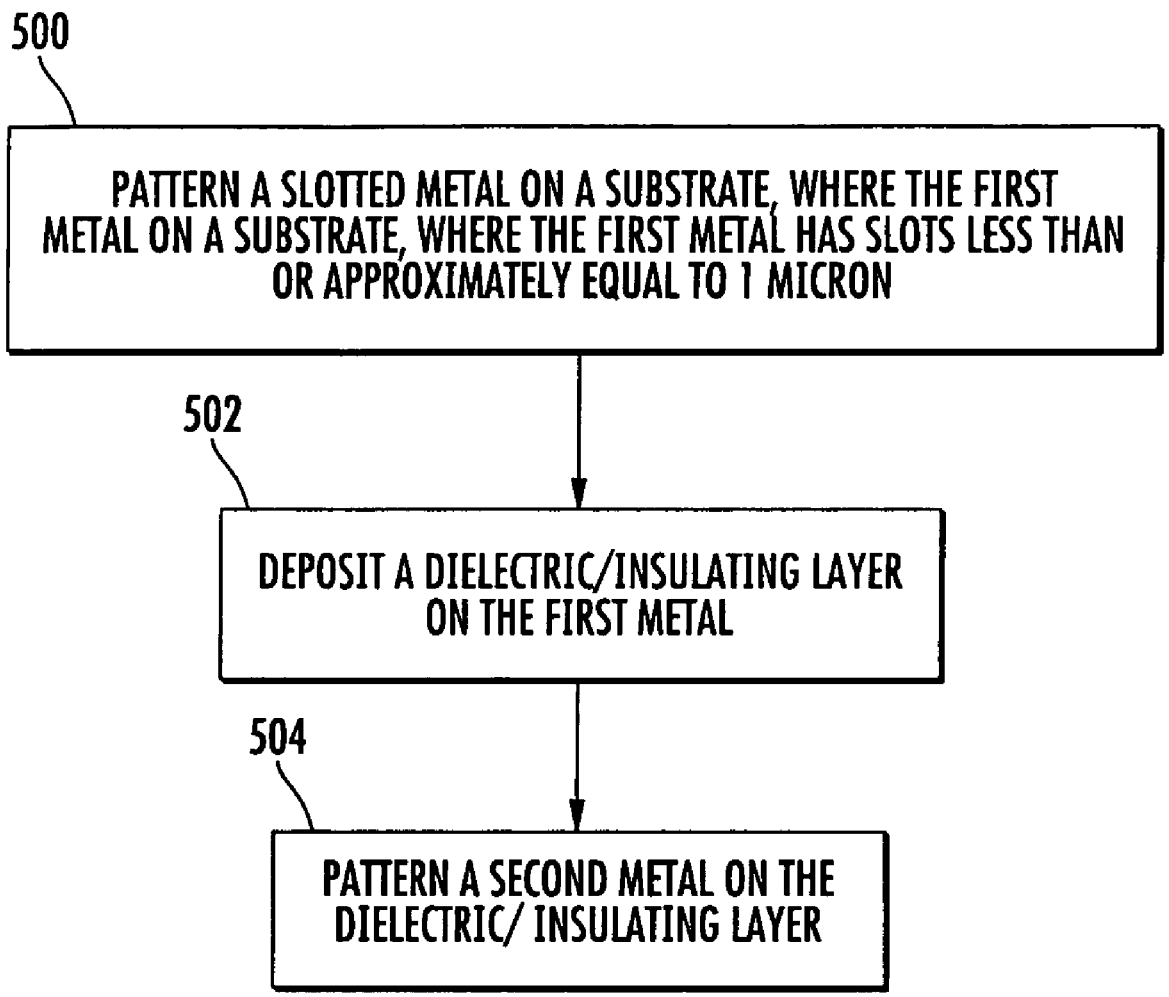
FIG. 5 is a flow chart of exemplary steps for forming a MEMS device having a slotted metal, a substrate, and a dielectric/insulating layer in accordance with an embodiment of the subject matter disclosed herein.

The embodiments of the subject matter shown in FIGS. 1-4 can be formed in accordance with any suitable MEMS fabrication process. FIG. 5 is a flow chart illustrating exemplary steps for forming a MEMS device having a slotted metal, a substrate, and a dielectric/insulating layer in accordance with an embodiment of the subject matter disclosed herein. In particular, FIG. 5 shows exemplary steps for forming slotted metal SM, dielectric/insulating layer DL, and metal component MC on substrate S shown in FIG. 3. These exemplary steps may also be applied for forming similar components described herein and shown in the other accompanying drawings. Referring to FIGS. 3 and 5, slotted metal SM can be attached to substrate S (step 500). In step 502, dielectric/insulating layer DL can be deposited on substrate S. In step 504, another metal is attached to dielectric/insulating layer DL. The second metal can be the slotted metal component MC as shown in FIG. 3 as being on dielectric/insulating layer DL. Alternatively, the second metal can be a solid metal layer component MC as shown in FIG. 4 as being on dielectric/insulating layer DL.

Figure 6:
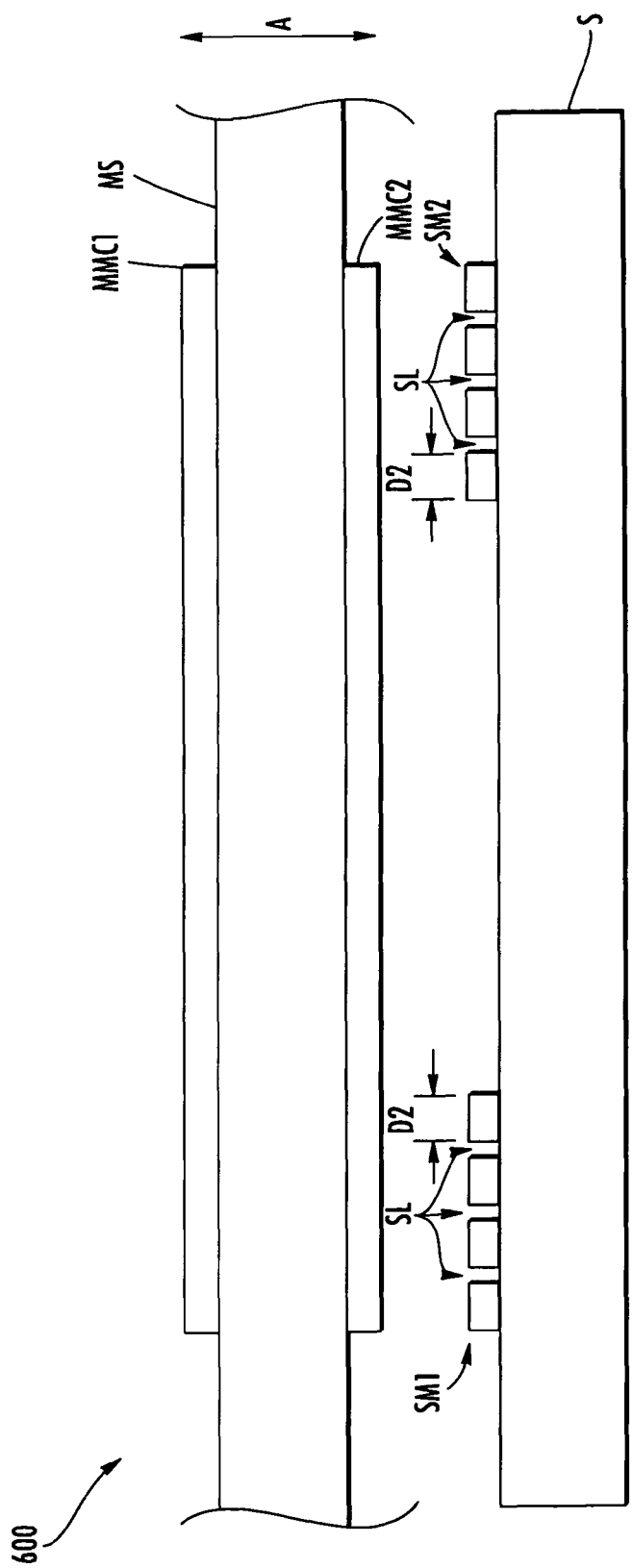
FIG. 6 is a cross-sectional side view of a MEMS device including a movable structure and stationary slotted metal components according to an embodiment of the subject matter disclosed herein.
Figure 7:
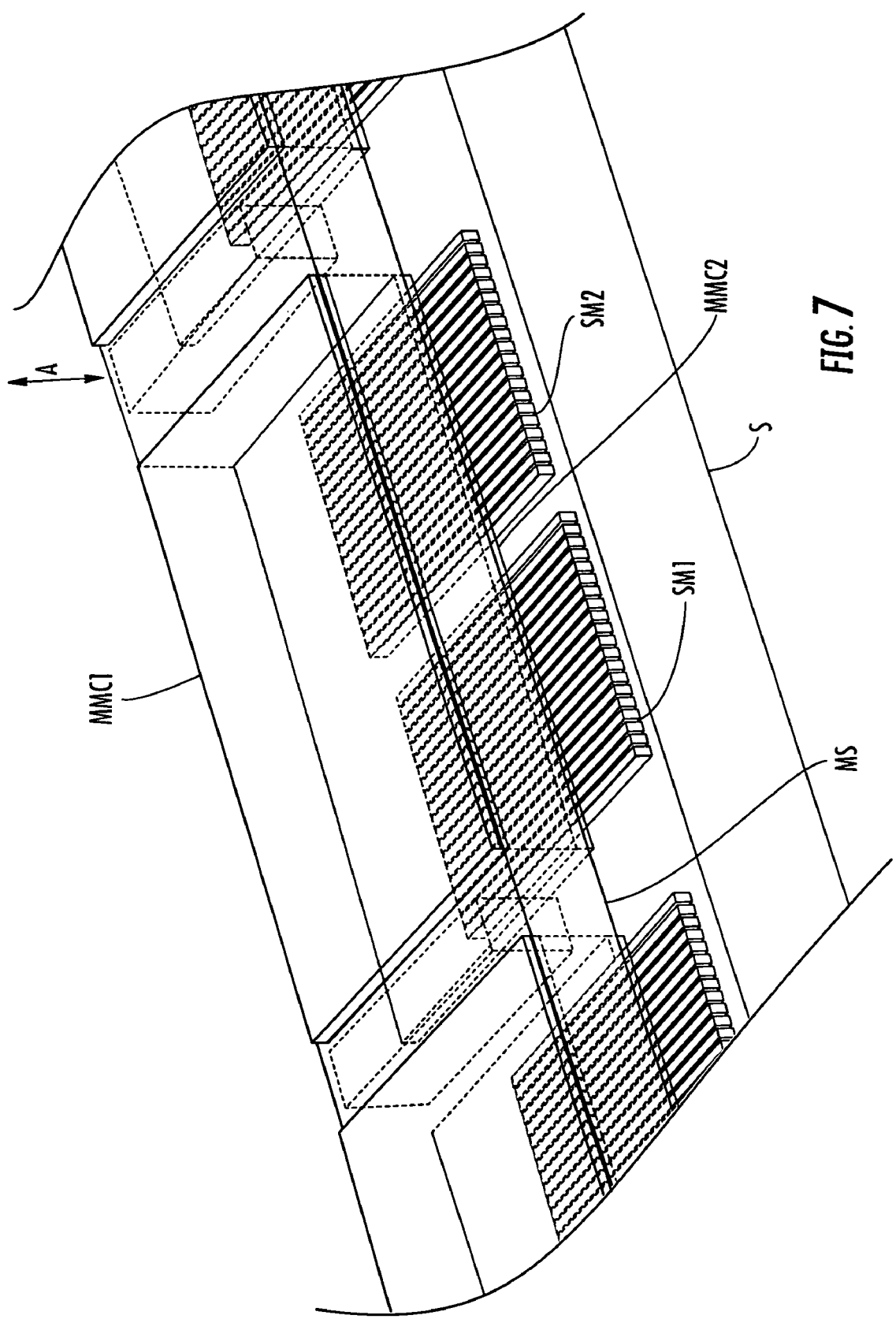
FIG. 7 is a top perspective view of a MEMS device including a movable structure and stationary slotted metal components according to an embodiment of the subject matter disclosed herein.

In yet another embodiment, a MEMS device can include a movable structure for operation with a slotted metal. FIGS. 6 and 7 are a cross-sectional side view and a top perspective view, respectively, of a MEMS device generally designated 600 including a movable structure MS and stationary slotted metal components SM1 and SM2 according to an embodiment of the subject matter disclosed herein. Referring to FIGS. 6 and 7, slotted metal components SM1 and SM2 are attached to substrate S. Slots SL can have a width of distance D1 that is less than or about 2 microns for resulting in metal line widths that are approximately the size of a single metallurgical grain in an unpatterned layer. Further, distance D1 can range between about 0.1 microns and 2.0 microns or any other suitable distance. The metal line widths of slotted metal components SM1 and SM2 can have a width of distance D2 that is within a range between about 0.1 microns and 2.0 microns or any other suitable distance.

Movable structure MS can be positioned above slotted metals SM1 and SM2 and can be movable with respect to the slotted metals. Further, movable structure MS may include movable metal components MMC1 and MMC2 attached to a surface of the movable structure. Slotted metals SM1 and SM2 can capacitively couple to metal components MMC1 and MMC2. In one example, MEMS device 600 may maintain the metallic components at the same distance with respect to one another such that the capacitance is constant. Alternatively, MEMS device 600 may be actuated to move movable structure MS in either an upward or downward direction (generally designated by opposing direction arrows A) for varying the capacitance.

Movable structure MS can comprise a dielectric or any other suitable material. For example, the movable structure can be made of silicon oxide ($SiO_2$, as it is sputtered, electroplated, spun-on, or otherwise deposited). The movable structure may provide electrical isolation and desirable mechanical properties including resiliency properties. Alternatively, the movable structure can comprise ($Si_xN_y$), silicon oxynitride, alumina or aluminum oxide ($Al_xO_y$), polymers, CVD diamond, their alloys, or any other suitable materials known to those of skill in the art. The movable structure can be designed to be resilient for generating a restorative force to return the structure to its natural position if the structure is deflected or bent.

Figure 8:
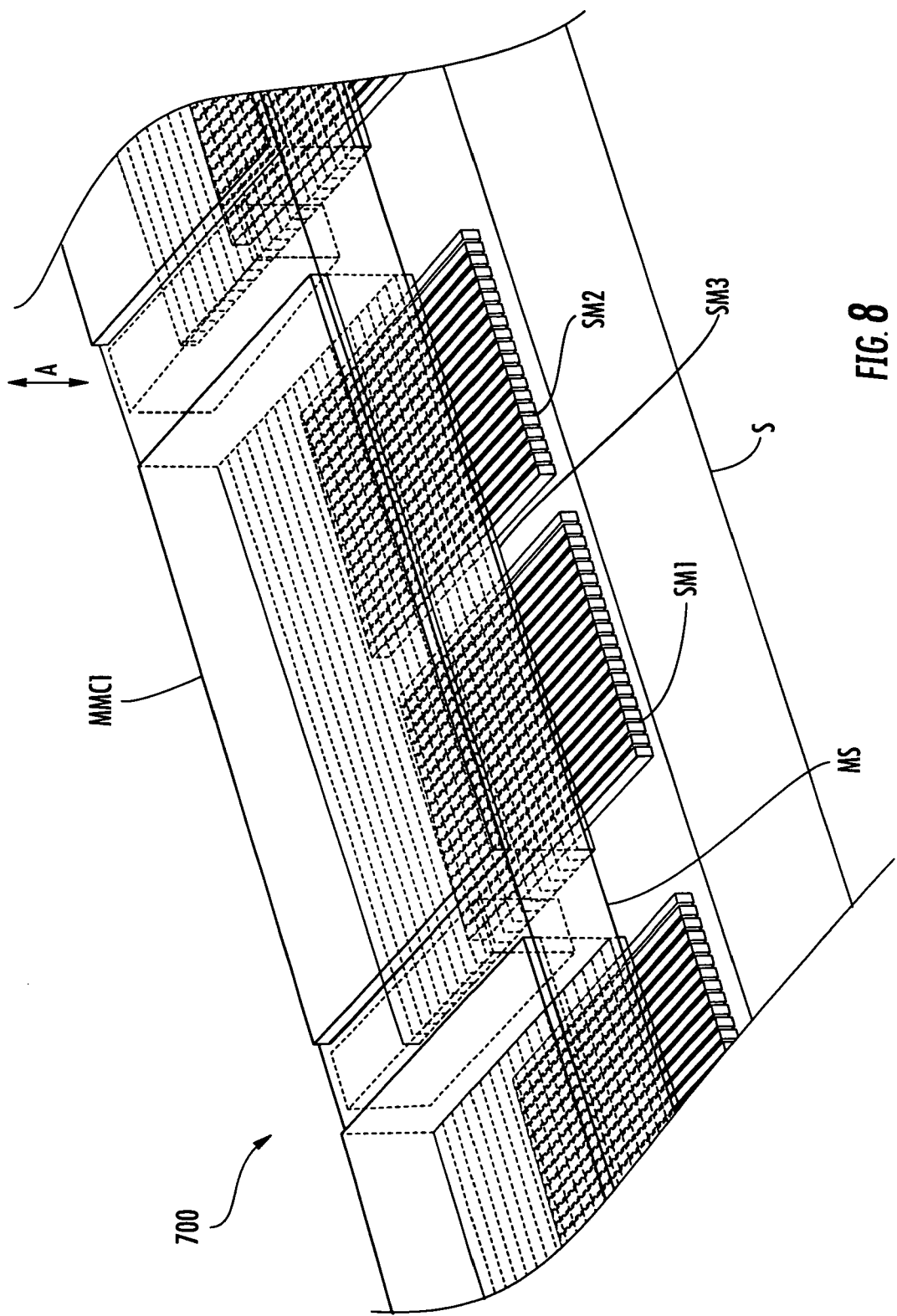
FIG. 8 is a top perspective view of a MEMS device including a movable slotted metal attached to a movable structure according to an embodiment of the subject matter disclosed herein.

FIG. 8 is a top perspective view of a MEMS device generally designated 800 including a movable slotted metal SM3 attached to movable structure MS according to an embodiment of the subject matter disclosed herein. Referring to FIG. 8, MEMS device 800 can be similar to MEMS device 600 shown in FIGS. 6 and 7 except that slotted metal SM3 replaces metal component MMC2 shown in FIGS. 6 and 7. The slots of metal SM3 can have a width that is less than or about 2 microns for resulting in metal line widths that are approximately the size of a single metallurgical grain in an unpatterned layer. Alternatively, the width of the slots can range between about 0.1 microns and 2.0 microns or any other suitable distance. The metal line widths of slotted metal components SM3 can have a width that ranges between about 0.1 microns and 2.0 microns or any other suitable distance.

The slots of metal SM3 can be arranged in an array that is substantially perpendicular to the arrangement of the slots of metals SM1 and SM2. Alternatively, the array of slots of metal SM3 and metals SM1 and SM2 can be substantially parallel to one another or any other suitable arrangement with respect to one another. Further, the slot arrays are on planes that are substantially parallel to one another but, in the alternative, the slot arrays can be arranged in another suitable way with respect to one another.

Figure 9:
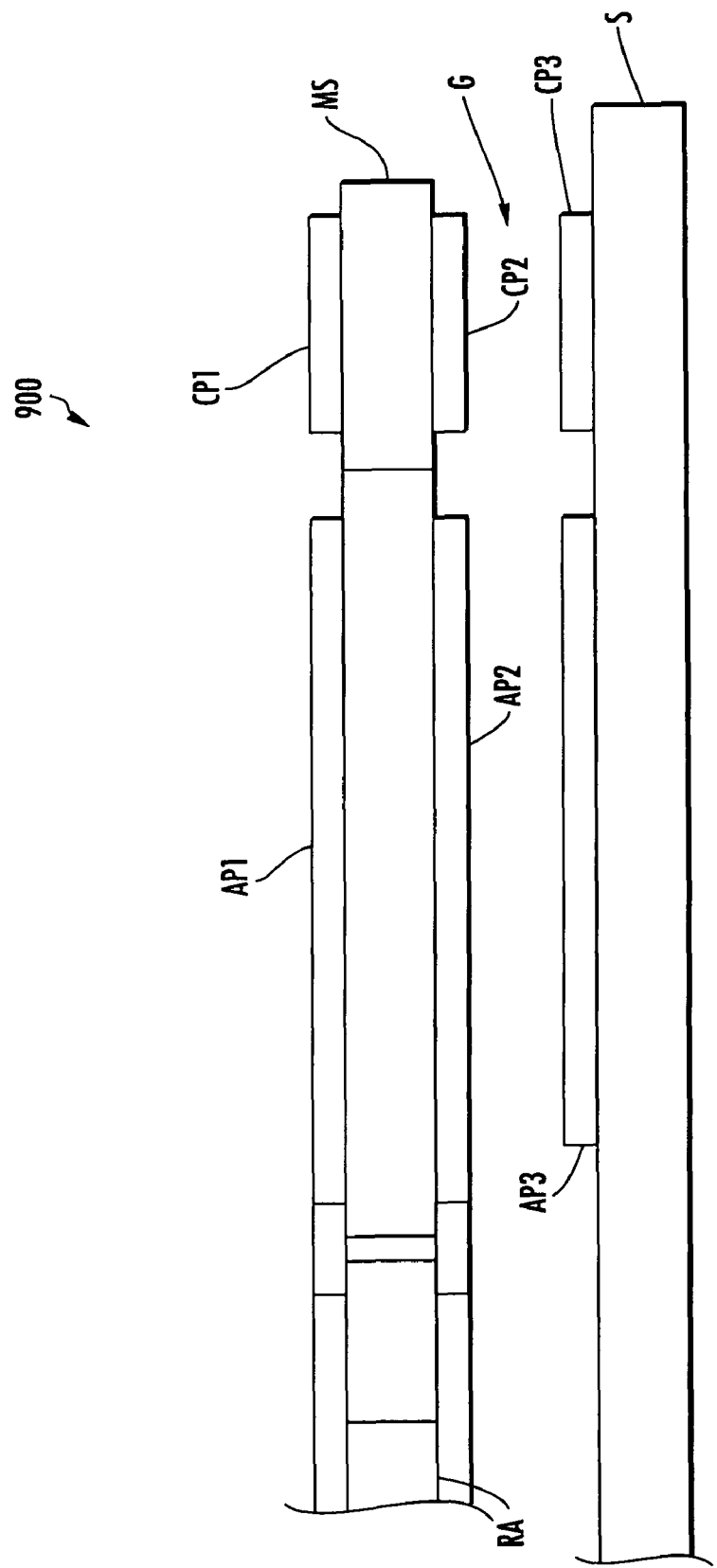
FIG. 9 is a cross-sectional side view of a MEMS variable capacitor including actuator plates and capacitive plates attached to a movable structure according to an embodiment of the subject matter disclosed herein.
Figure 10:
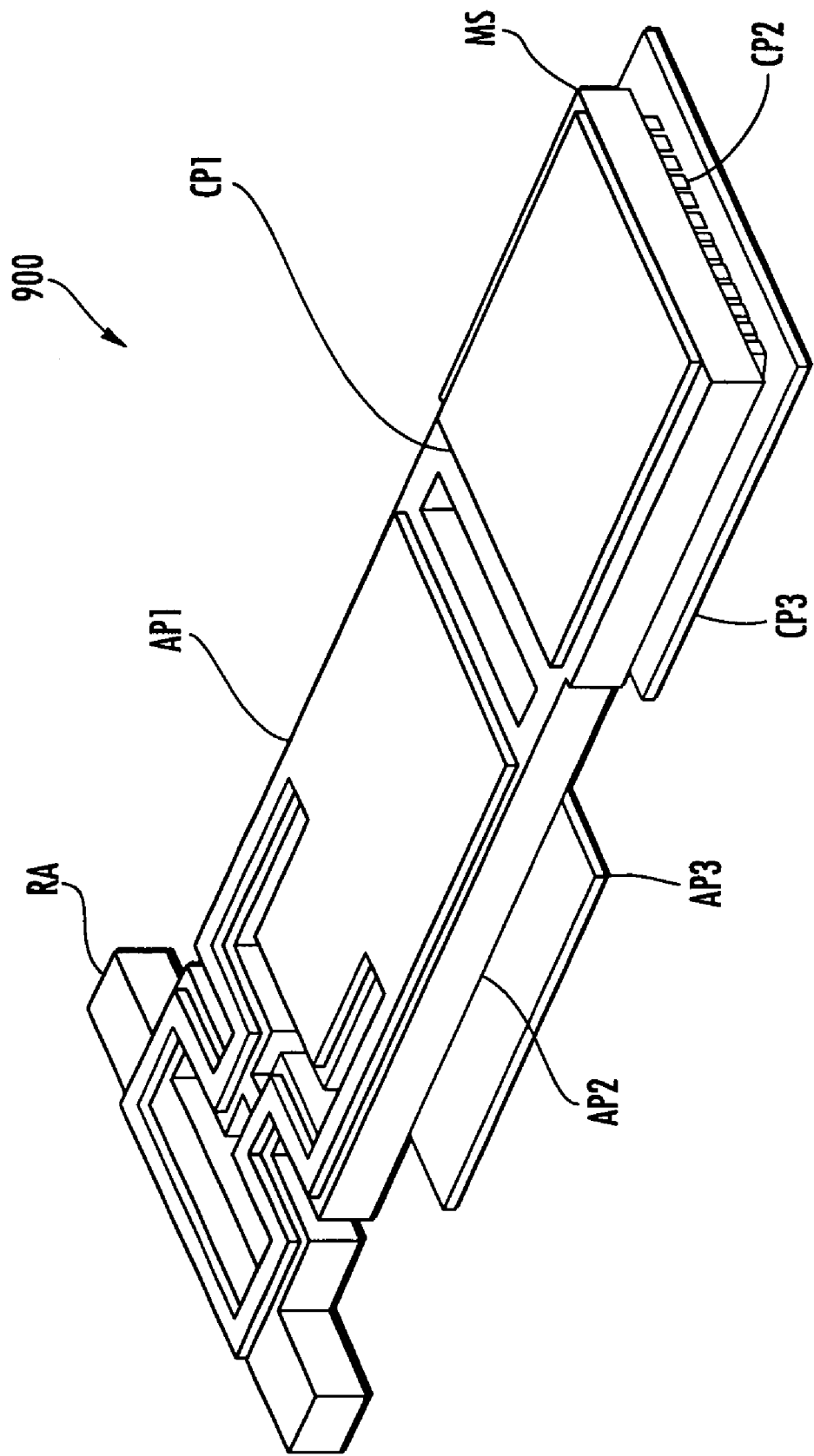
FIG. 10 is a top perspective view of a MEMS variable capacitor including actuator plates and capacitive plates attached to a movable structure according to an embodiment of the subject matter disclosed herein.

FIGS. 9 and 10 are a cross-sectional side view and a top perspective view, respectively, of a MEMS variable capacitor generally designated 900 including actuator plates AP1 and AP2 and capacitive plates CP1 and CP2 attached to movable structure MS according to an embodiment of the subject matter disclosed herein. Referring to FIGS. 9 and 10, movable structure MS is positioned over actuator plate AP3 and capacitive plate CP3, which are attached to a top surface of substrate S. MEMS variable capacitor 100 is illustrated in a non-activated position. Movable structure MS can include a root anchor RA that is fixedly mounted with respect to substrate S. The opposing end may be freely movable with respect to substrate S. A gap G can separate movable structure MS and its attached components from substrate S and its attached components. The distance between components CP2 and CP3 can be the same as the distance between components AP2 and AP3. Alternatively, the distance between components CP2 and CP3 can be different than the distance between components AP2 and AP3.

A voltage difference can be applied across actuator plate AP3 and one or both of actuator plates AP1 and AP2 to create an electrostatic field, which causes an attractive force between actuator plate AP3 and at least one of the other actuator plates attached to movable structure MS. Actuator plates AP1 and AP2 can be electrically connected to one terminal of a voltage source (not shown) and actuator plate AP3 may be connected to the other terminal of the voltage source for applying the voltage difference. Alternatively, only one of actuator plates AP1 and AP2 may be connected to a terminal and actuator plate AP3 connected to the other terminal. Upon application of the voltage difference, movable structure MS bends in a direction towards substrate S. The voltage source may apply a variable voltage difference for controlling the distance between movable structure MS and substrate S. Variation in the movement of movable structure MS with respect to substrate S causes a capacitance between capacitive plate CP3 and one or both of capacitive plates CP1 and CP2. The capacitive plates may be operationally connected to an RF signal line (not shown).

Figure 11:
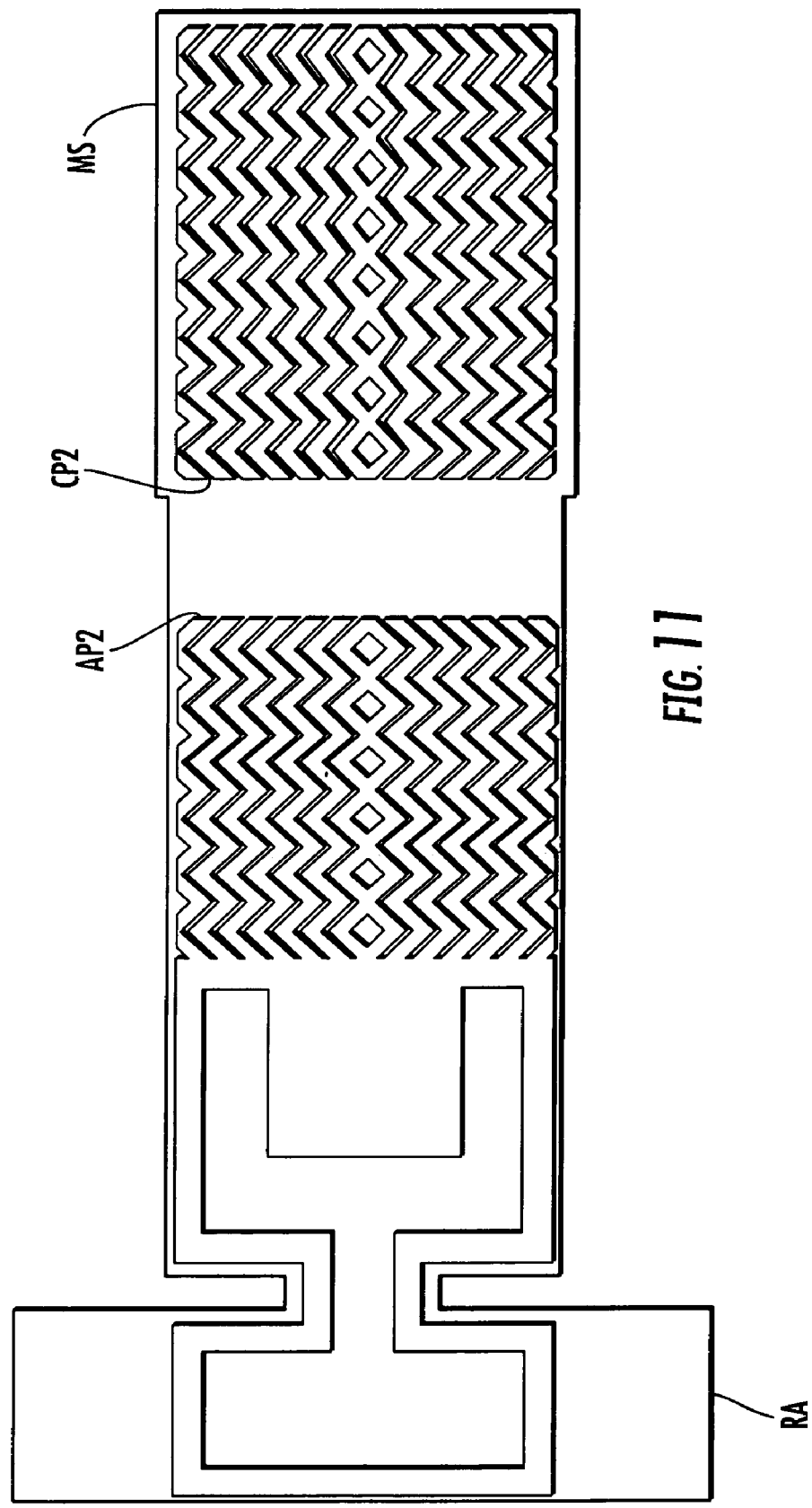
FIG. 11 is a bottom view of a movable structure of a MEMS variable capacitor according to an embodiment of the subject matter disclosed herein.

Actuator plates AP1, AP2, and AP3 and capacitive plates CP1, CP2, and CP3 can be any combination of solid metal components and slotted metal components. Alternatively, all of the actuator plates and capacitive plates can be wholly or partially slotted. FIG. 11 is a bottom view of movable structure MS of MEMS variable capacitor 900 according to an embodiment of the subject matter disclosed herein. Referring now to FIG. 11, capacitive plate CP2 is formed in a zig-zag pattern for hillock control. Further, a portion of actuator plate AP2 can be formed in a zig-zag pattern for hillock control. The other portion of actuator plate AP2 can be solid. In this example, the zig-zag pattern forms slots that extend substantially along the length of movable structure MS. Alternatively, the zig-zag pattern can extend substantially perpendicular to the length of movable structure MS. The current provided to the plates can flow in a direction that would flow in a solid metal of similar geometry. Thus, when providing the zig-zag patterned structure, the slots of the structure can be arrange to extend in a predetermined direction of current flow. In other words, the slots can be substantially aligned on the average with the direction of current that would flow in the solid metal of similar geometry.

Slotted metals on substrates as described herein can be utilized in MEMS variable capacitor systems. For example, slotted metals as described herein can be used as actuation electrodes and/or capacitive plates of the MEMS variable capacitor systems disclosed in U.S. patent application Ser. No. 11/715,676, titled "Micro-Electro-Mechanical System (MEMS) Variable Capacitors and Actuation Components and Related Methods," the contents of which are incorporated herein by reference in their entireties. The slotted metal components may be suitably attached to any of the stationary and/or movable components of the system.

Figure 12:
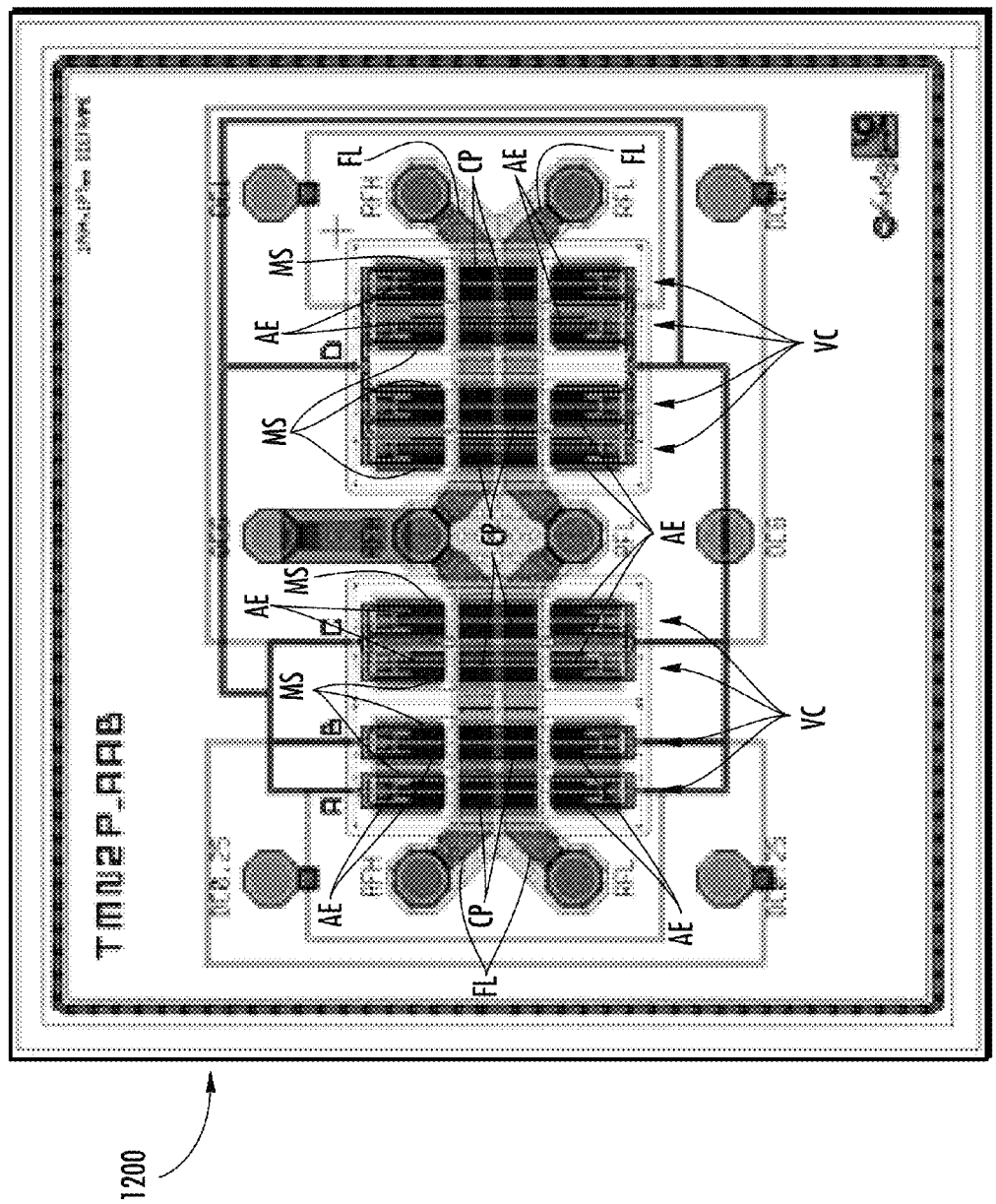
FIG. 12 is a top view of a MEMS variable capacitor system having slotted metal components in accordance with the subject matter described herein.
Figure 13:
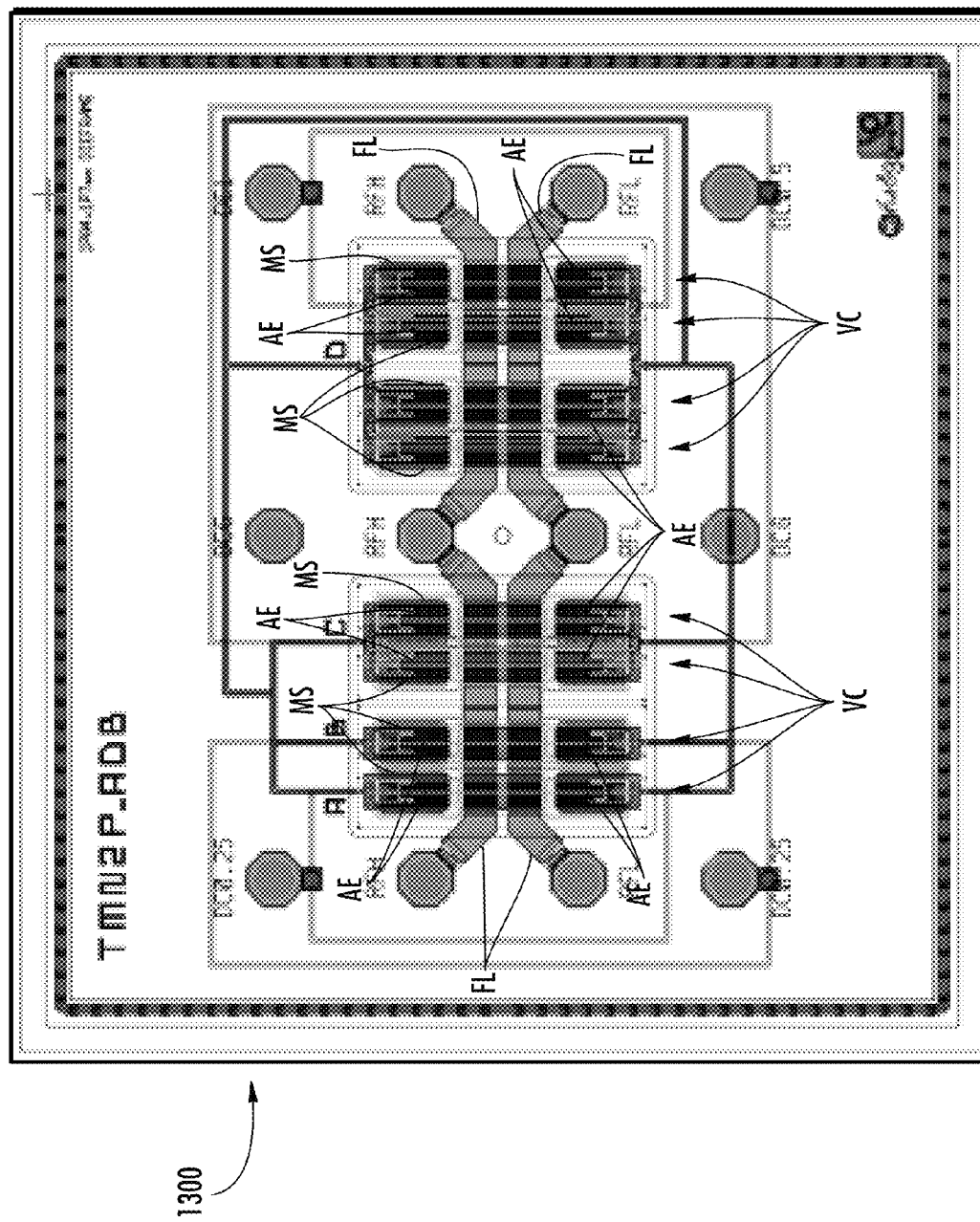
FIG. 13 is a top view of a MEMS variable capacitor system having slotted metal components in accordance with the subject matter described herein.

FIGS. 12 and 13 are top views of different MEMS variable capacitor systems generally designated 1200 and 1300, respectively, having slotted metal components in accordance with the subject matter described herein. Referring to FIGS. 12 and 13, systems 1200 and 1300 can include cantilever-type variable capacitors generally designated VC. Each variable capacitor VC can include movable structures MS having actuation electrodes AE and capacitive plates CP. Capacitive plates CP can be positioned over feed lines FL, which are capacitively coupled to corresponding capacitive plates CP. Some or all of capacitive plates CP, actuation electrodes AE, and feed lines FL can be partially or fully slotted in accordance with the subject matter described herein for reducing or eliminating hillock formation.

Experimental Results

Experimental results were obtained by fabricating MEMS components having slotted metals in accordance with the subject matter described herein. The experimental results will now be described with reference to FIGS. 14-40.

FIGS. 14-17 are top perspective views of MEMS device metal components having slots and line widths of varying sizes in accordance with the subject matter disclosed herein. Referring to FIGS. 14-17, metal components of the MEMS devices have been slotted in accordance with the subject matter disclosed herein. The MEMS devices shown in FIGS. 14-17 were fabricated according to the same techniques and a similar design.

Figure 14:
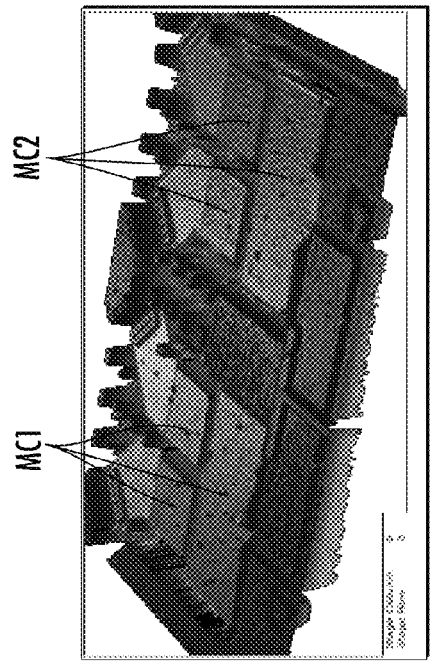
FIGS. 14-17 are top perspective views of MEMS device metal components having slots and line widths of varying sizes in accordance with the subject matter disclosed herein.
Figure 15:
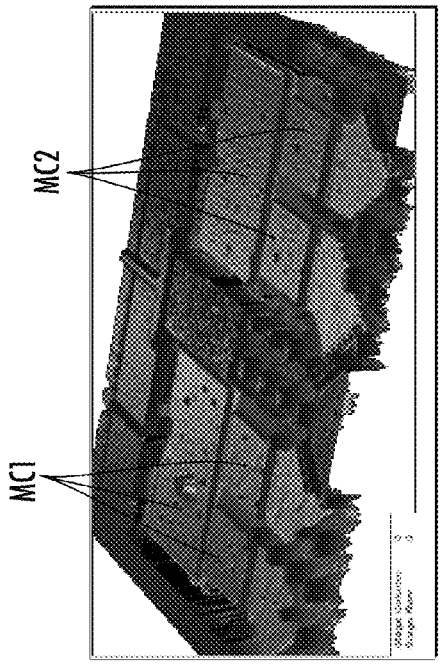
Figure 16:
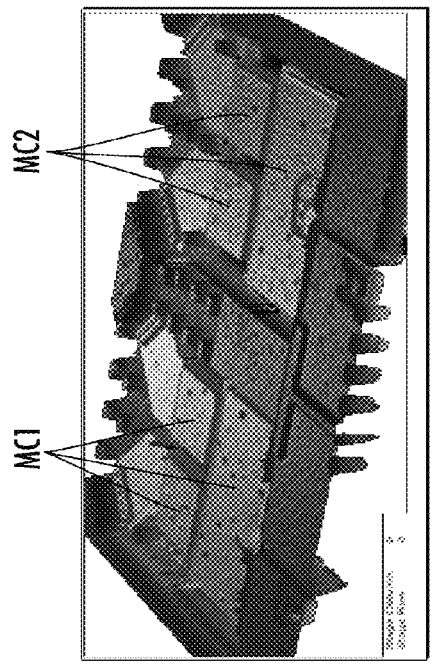
Figure 17:
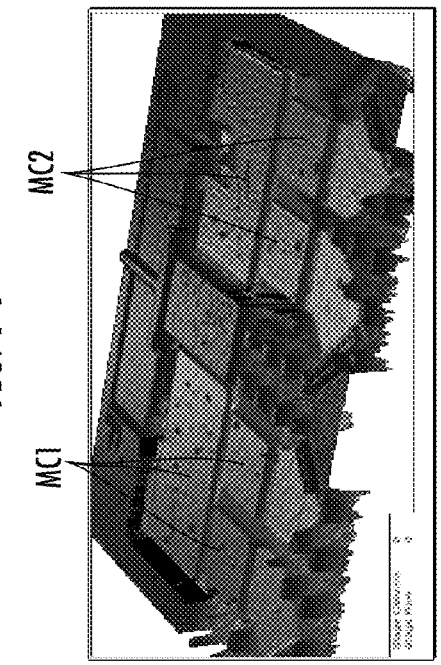

For the purpose of showing the effects on hillock formation, the only differences in the design of the MEMS devices shown in FIGS. 14-17 are the slot sizes and line widths of the shown top metal components. In FIG. 14, metal components MC1 have slot sizes of about 0.5 microns and have line widths of about 5.0 microns. Further, in FIG. 14, metal components MC2 have slot sizes of about 0.5 microns and have line widths of about 2.5 microns. In FIG. 15, metal components MC1 have slot sizes of about 0.8 microns and have line widths of about 8.0 microns. Further, in FIG. 15, metal components MC2 have slot sizes of about 0.8 microns and have line widths of about 4.0 microns. In FIG. 16, metal components MC1 have slot sizes of about 1.0 micron and have line widths of about 5.0 microns. Further, in FIG. 16, metal components MC2 have slot sizes of about 0.5 microns and have line widths of about 10.0 microns. In FIG. 17, metal components MC1 have slot sizes of about 1.0 micron and have line widths of about 20.0 microns. Further, in FIG. 17, metal components MC2 have slot sizes of about 1.0 micron and have line widths of about 10.0 microns. These results show benefits of using line widths of less than about 2.5 microns for reducing hillock size and/or eliminating hillock formation.

FIGS. 18-21 are top perspective views of MEMS device metal components having holes of varying sizes. Referring to FIGS. 18-21, metal components of the MEMS devices have holes extending from a top surface to a bottom surface. The MEMS devices shown in FIGS. 18-21 were fabricated according to the same techniques and a similar design. These results show that various hole patterns did not affect the hillocks, while slotting in accordance with the subject matter disclosed herein does show improvement.

Figure 18:
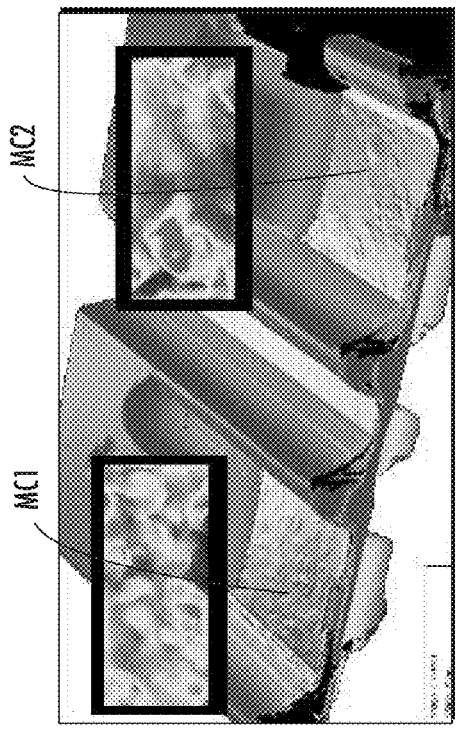
FIGS. 18-21 are top perspective views of MEMS device metal components having slots and line widths of varying sizes in accordance with the subject matter disclosed herein.
Figure 19:
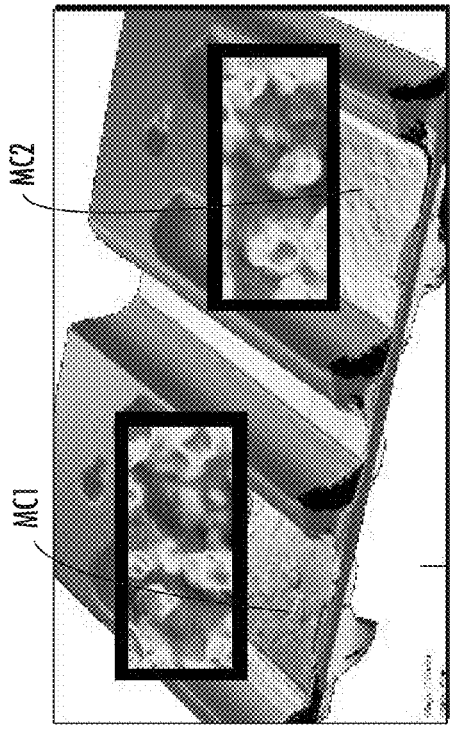
Figure 20:
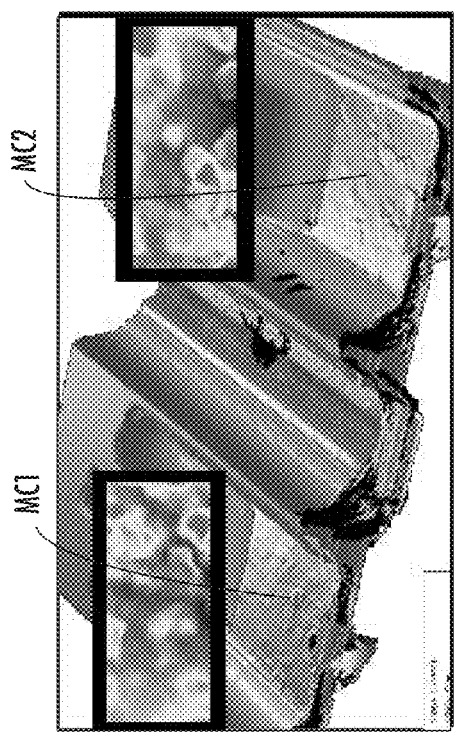
Figure 21:
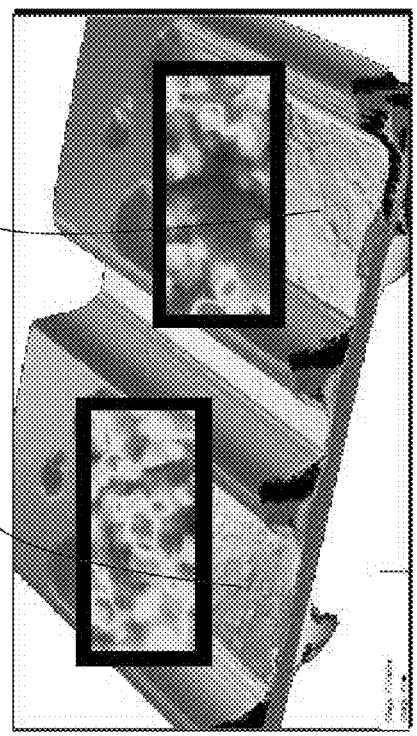

For the purpose of showing the effects on hillock formation, the only differences in the design of the MEMS devices shown in FIGS. 18-21 are the hole sizes and line widths of the shown top metal components. In FIG. 18, metal component MC1 has hole sizes of about 1.0 micron and has line widths of about 10.0 microns. Further, in FIG. 18, metal component MC2 has hole sizes of about 1.0 micron and has line widths of about 5.0 microns. In FIG. 19, metal component MC1 has hole sizes of about 1.0 micron and has line widths of about 20.0 microns. Further, in FIG. 19, metal component MC2 has hole sizes of about 1.0 micron and has line widths of about 20.0 microns. In FIG. 20, metal component MC1 has hole sizes of about 0.8 microns and has line widths of about 8.0 microns. Further, in FIG. 20, metal component MC2 has hole sizes of about 0.8 microns and has line widths of about 8.0 microns. In FIG. 21, metal component MC1 has hole sizes of about 0.8 microns and has line widths of about 8.0 microns. Further, in FIG. 21, metal component MC2 has hole sizes of about 0.8 microns and has line widths of about 8.0 microns. The inset images in FIGS. 17-21 show zoomed in views of corresponding metal component surfaces. FIGS. 17-21 included metal components that were patterned with arrays of holes of the dimensions described hereinabove. The hole patterns were not effective at eliminating or limiting the growth of hillocks for the line widths represented.

Figure 22:
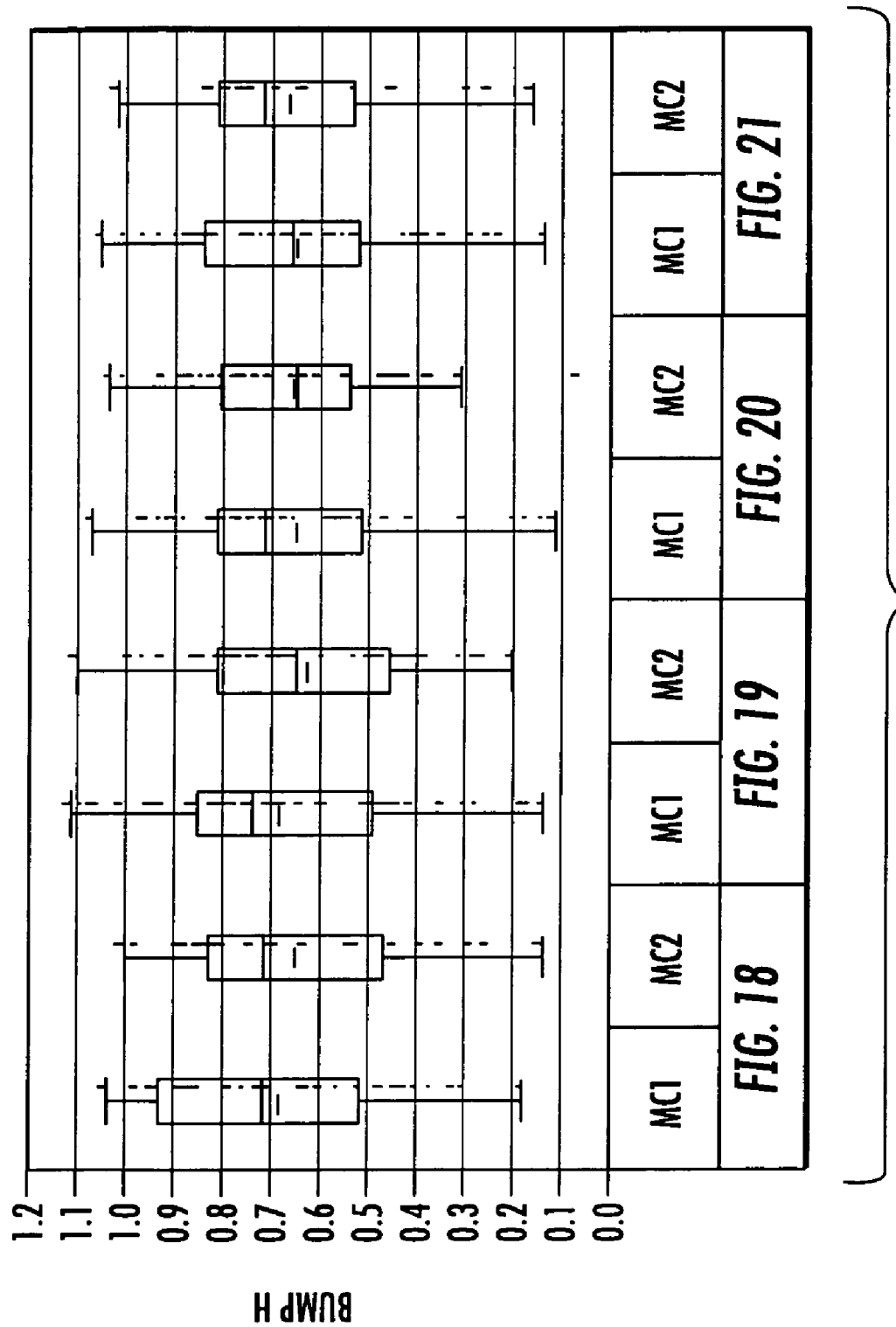
FIG. 22 is a variability chart showing hillock heights for the metal components of the MEMS devices shown in FIGS. 18-21.

FIG. 22 is a variability chart showing hillock heights for the metal components of the MEMS devices shown in FIGS. 18-21. The chart shows the graphs corresponding to each of the metal components of FIGS. 18-21 and that there is little difference between them.

Figure 23:
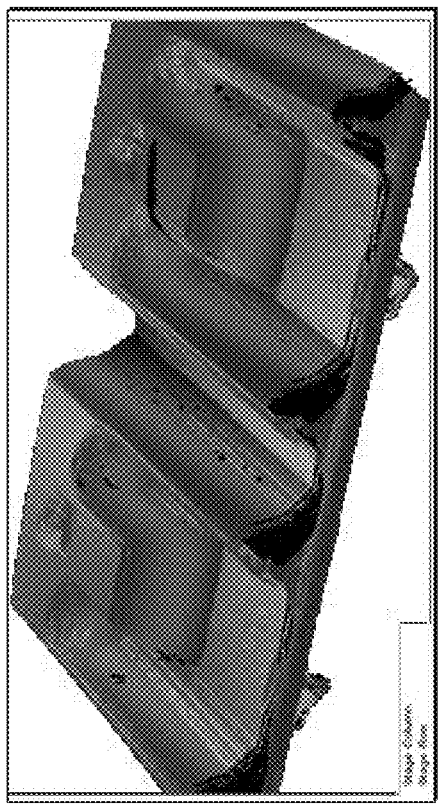
FIGS. 23-26 are top perspective views of MEMS device metal components having slots and line widths of varying sizes in accordance with the subject matter disclosed herein.
Figure 24:
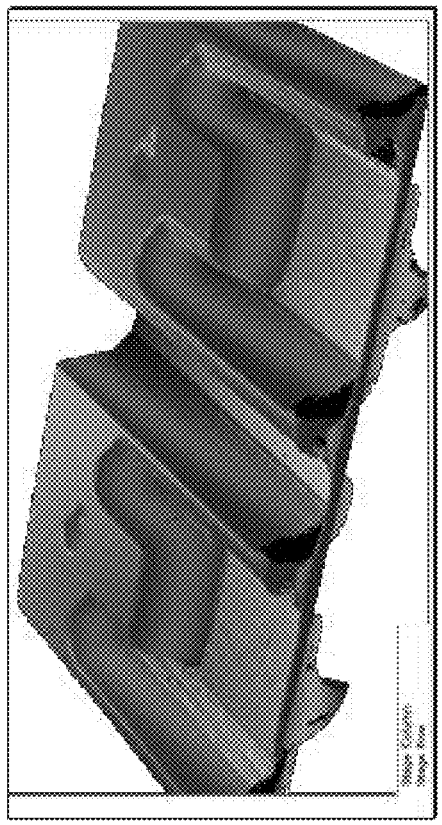
Figure 25:
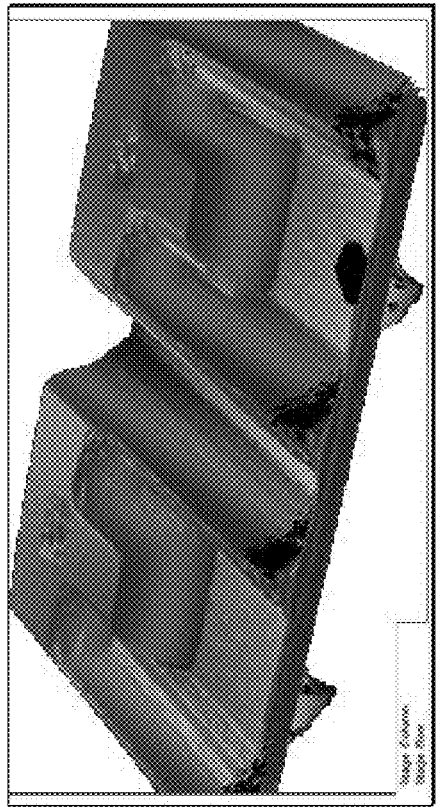
Figure 26:
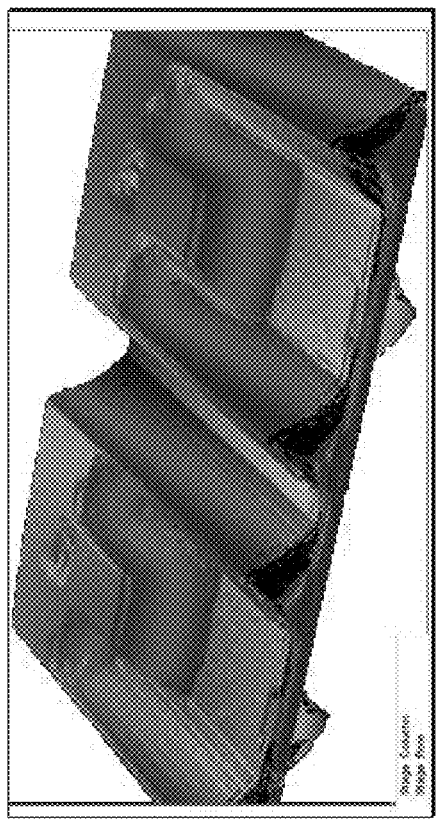

FIGS. 23-26 are top perspective views of MEMS device metal components having holes. Referring to FIGS. 23-26, metal components of the MEMS devices have holes extending between top and bottom surfaces. The MEMS devices shown in FIGS. 23-26 were fabricated according to the same techniques and a similar design. In FIG. 23, the metal components are unpatterned. In FIG. 24, the metal components have hole sizes of 0.8, 1, 1 or 1 micron and line widths of 8, 5, 10, or 20 microns. In FIG. 25, the metal components are unslotted. In FIG. 26, the metal components have hole sizes (0.5 or 0.8 microns) and line widths (2, 5, 5, 10, or 4 microns). These hole patterns were not effective at eliminating or limiting the formation of hillocks.

Figure 27:
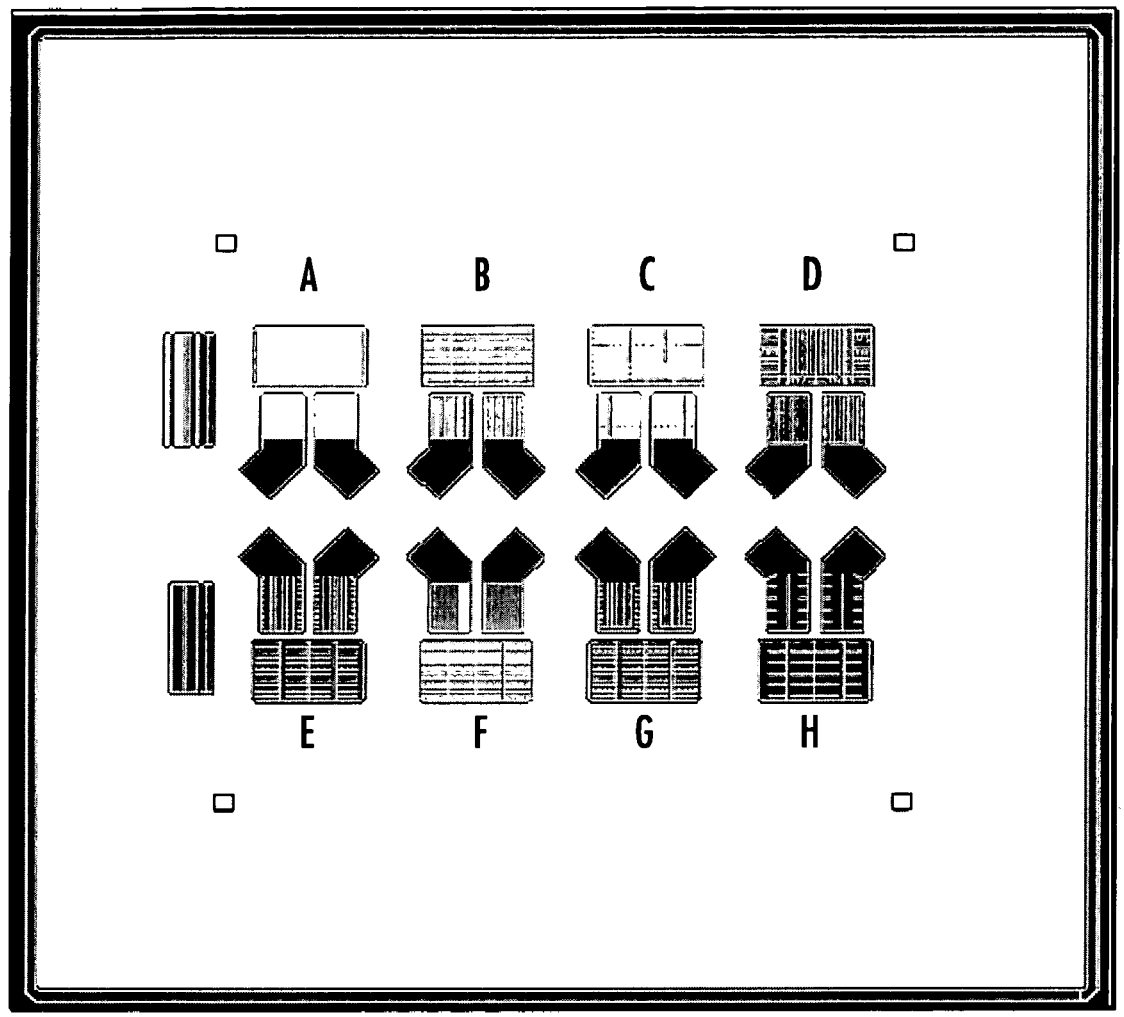
FIG. 27 is a top view of metal component surfaces having slots of variable width in accordance with an embodiment of the subject matter disclosed herein.

FIG. 27 is a top view of metal component surfaces having slots of variable width in accordance with an embodiment of the subject matter disclosed herein. FIG. 27 shows a group of seven (7) lines that are all spaced by 5 microns. The lines have line widths of 2.5 microns, 5 microns, 10 microns, and 20 microns. Further, FIG. 27 shows a second group of two (2) lines that are spaced by 5 microns and have line widths of 20 microns and 50 microns.

Figure 29:
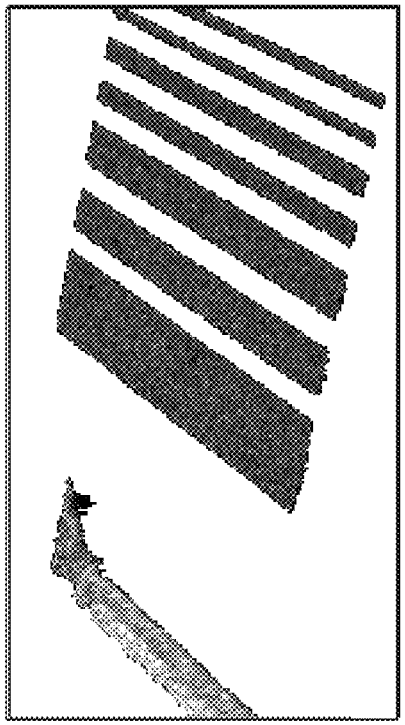
FIGS. 28-31 are top perspective views of MEMS device metal components having slots and line widths of varying sizes in accordance with the subject matter disclosed herein.
Figure 31:
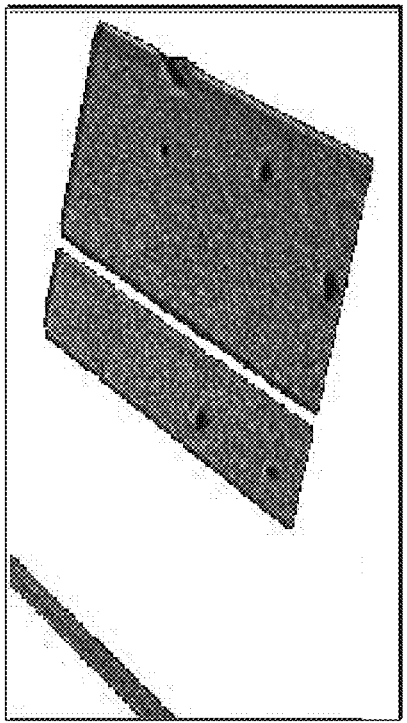
Figure 28:
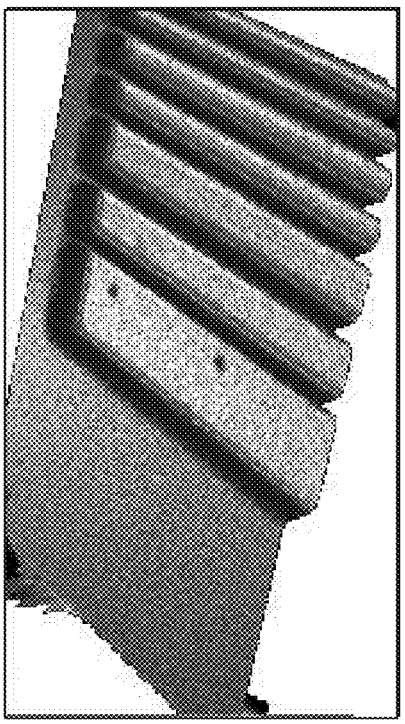
Figure 30:
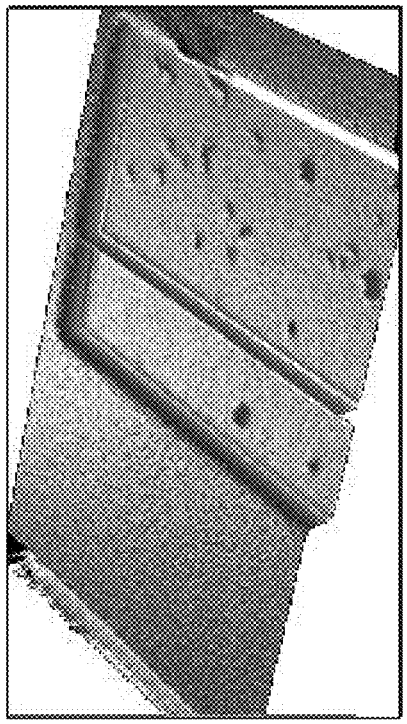
Figure 32:
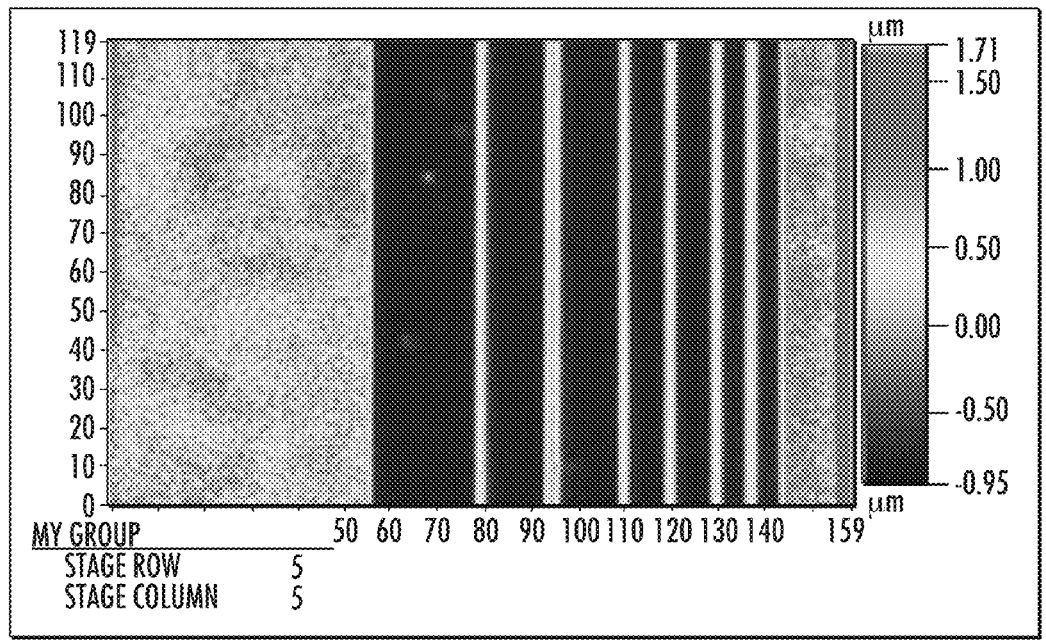
FIGS. 32-35 are top views of slotted metals having variable line width distances according to an embodiment of the subject matter disclosed herein.
Figure 33:
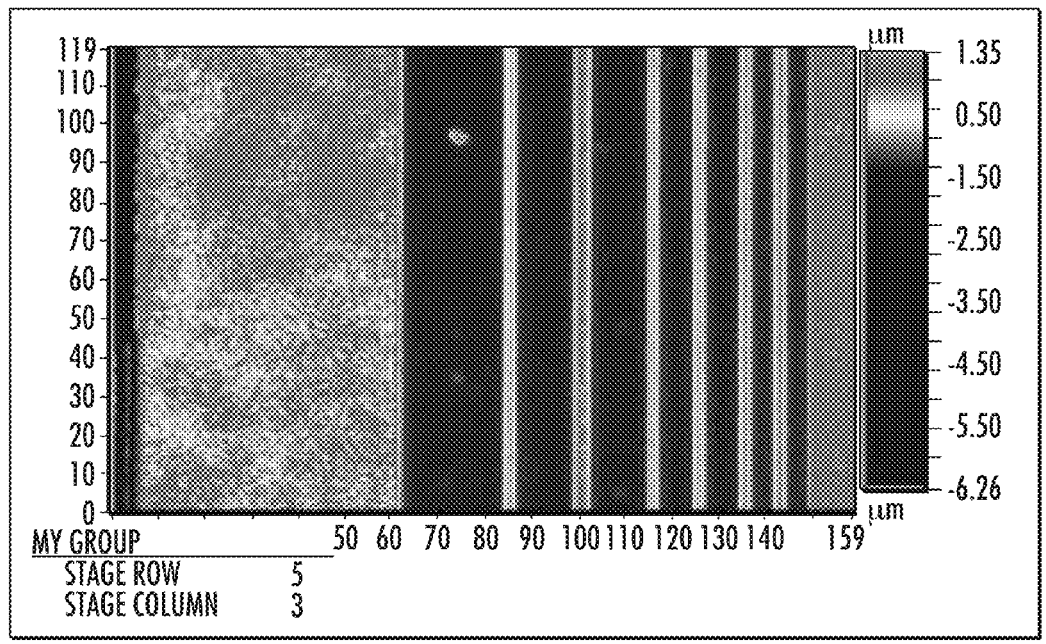
Figure 34:
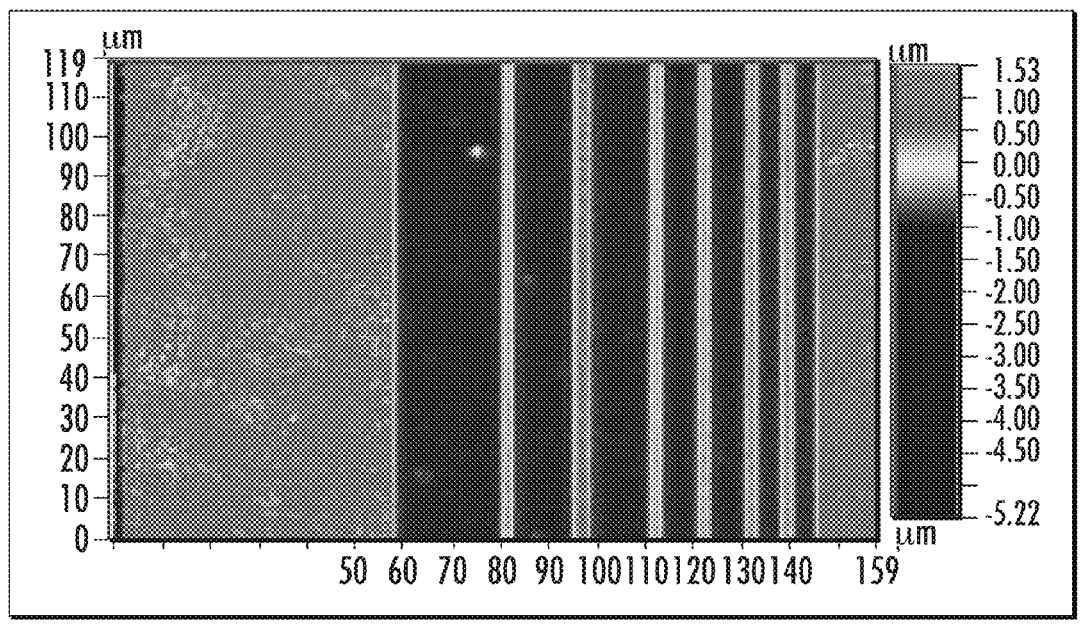
Figure 35:
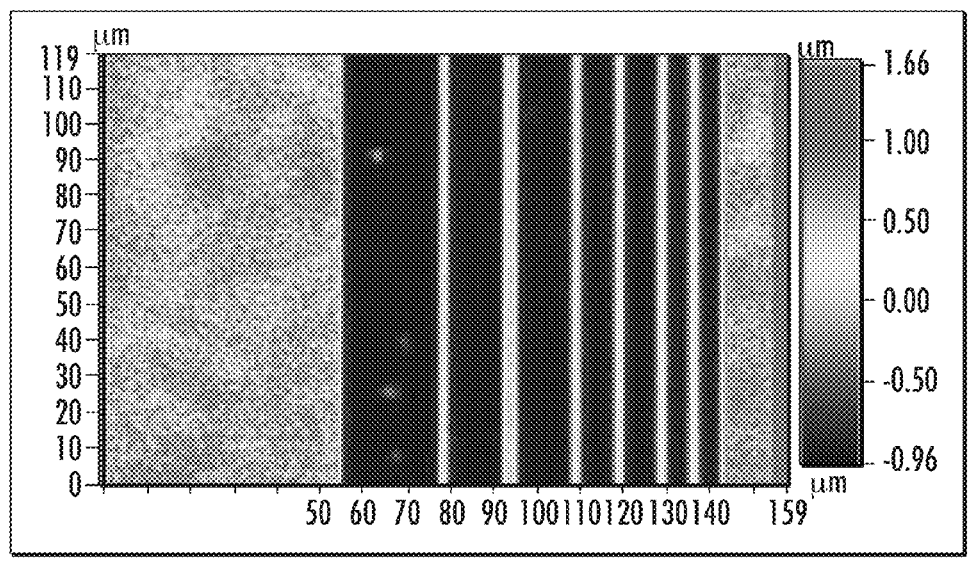

FIGS. 28-31 are top perspective views, as viewed through an optical interferometer, of MEMS device metal components having slots and line widths of varying sizes in accordance with the subject matter disclosed herein. Referring to FIGS. 28-31, metal components of the MEMS devices have been slotted in accordance with the subject matter disclosed herein. The MEMS devices shown in FIGS. 28-31 were fabricated according to the same techniques and a similar design. In FIG. 28, the metal components have slot sizes of 5 microns. In FIG. 28, the metal components have line widths of 2.5 microns, 5 microns, 10 microns, and 20 microns. In FIG. 29, the metal components have slot sizes of 5 microns. In FIG. 29, the metal components have line widths of 2.5 microns, 5 microns, 10 microns, and 20 microns. In FIG. 30, the metal components have slot sizes of 5 microns and line widths of 20 microns and 50 microns. In FIG. 31, the metal components have slot sizes of 5 microns and line widths of 20 and 50 microns. The results of the tests of the MEMS device metal components shown in FIGS. 28-31 suggest that the surfaces of structures having 5 micron lines and narrower are substantially free of hillocks.

FIGS. 32-35 are top views of slotted metals having variable line width distances according to an embodiment of the subject matter disclosed herein. The variability in line width is in the micron scale. 10 micron lines show some incidence of hillocks. 5 micron lines show no incidence of hillocks. These images show the line widths ranging from 2.5 microns, 5 microns, 10 microns, and 20 microns. The 10 micron and 20 microns lines typically show hillocks of various dimensions and heights. The 5 microns and 2.5 microns line widths show much few incidence of hillocks.

FIG. 36 is a top view of the surfaces of slotted and unslotted metals for the purpose of comparison. Hillocks do not appear to be formed in slotted metal surfaces directly compared to unslotted metals from the same wafer. Some hillocks do form in unslotted metal areas attached to the slotted metals but not in the slotted areas themselves.

Figure 37:
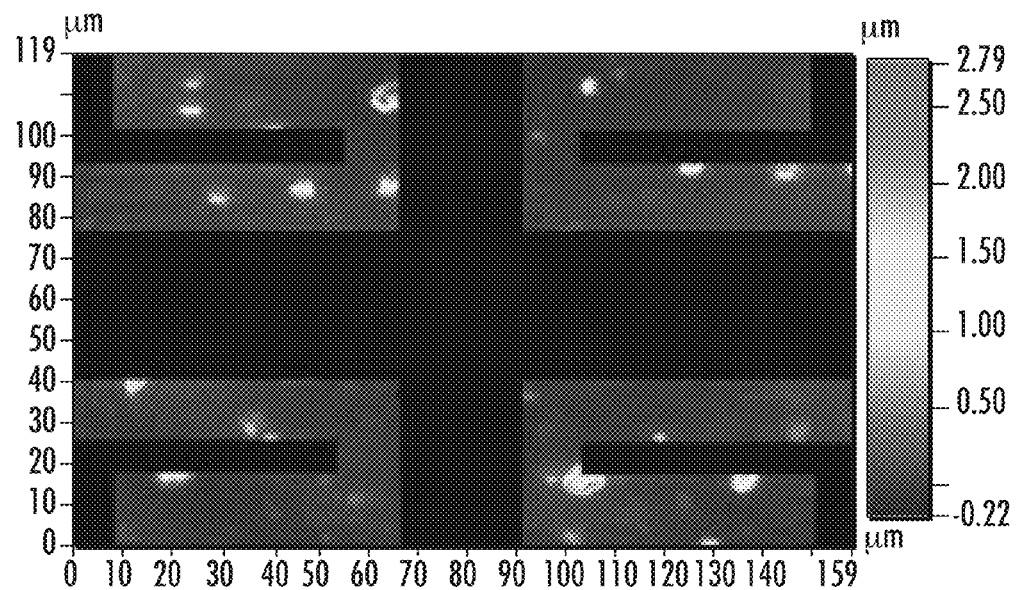
FIGS. 37-40 are top views of portions of MEMS metal structures having holes formed therein.
Figure 38:
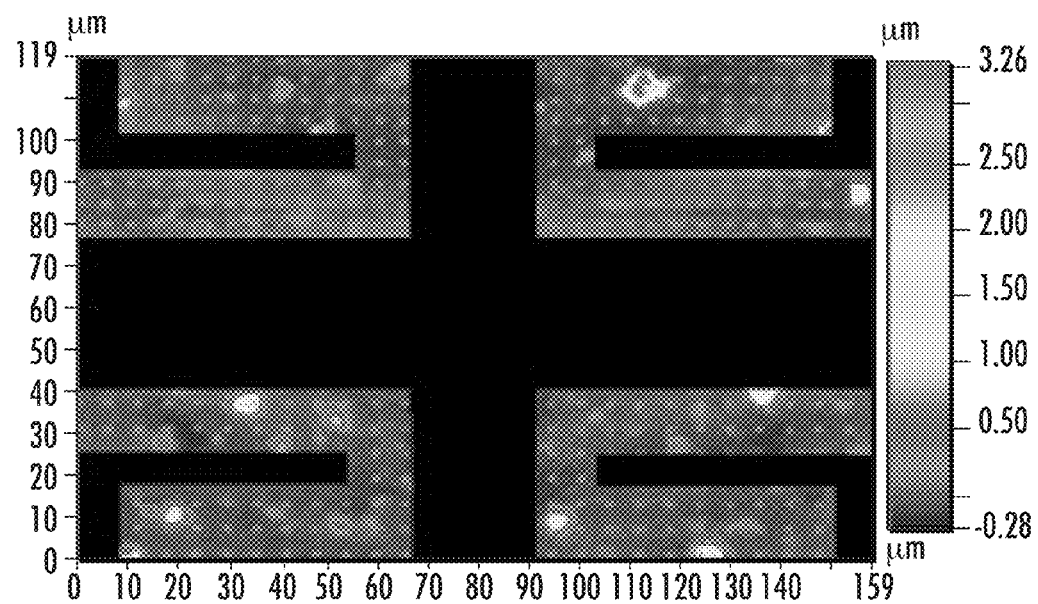
Figure 39:
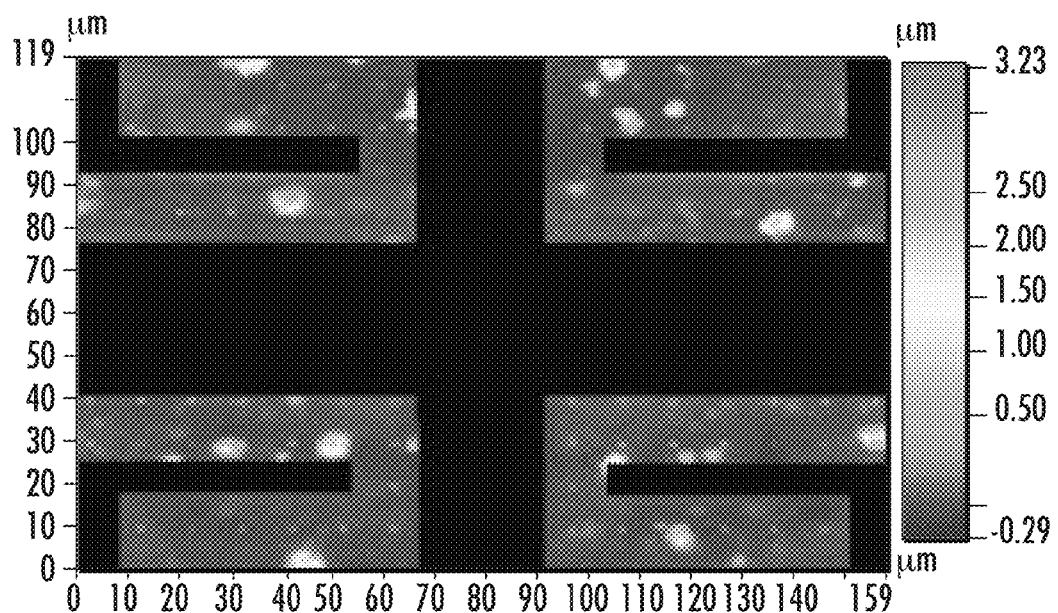
Figure 40:
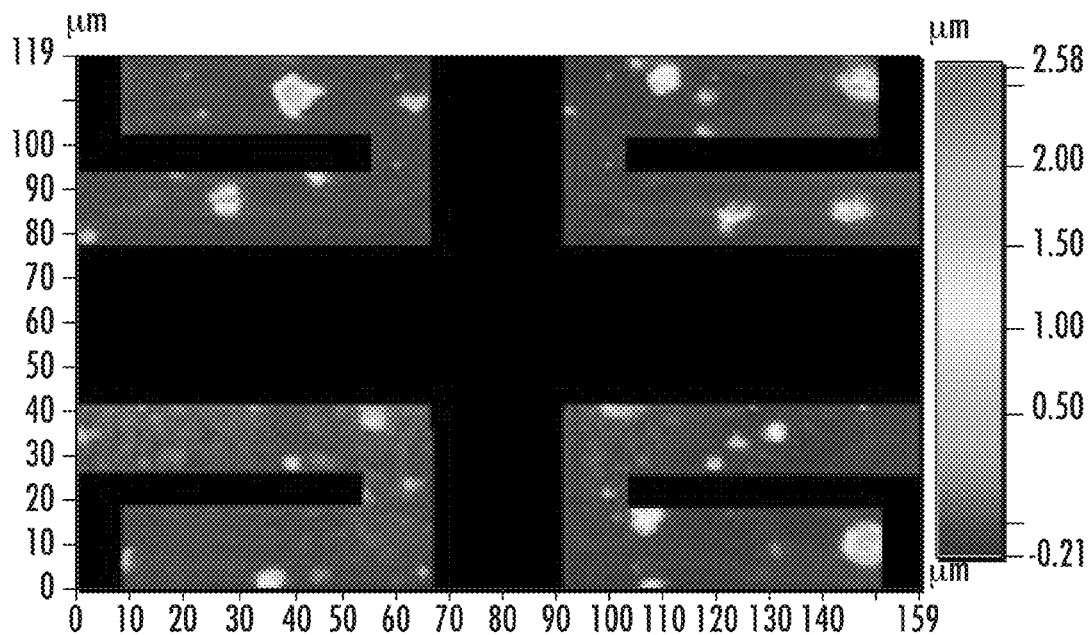

FIGS. 37-40 are top views of portions of MEMS metal structures having holes formed therein. In FIG. 37, the metal component has hole sizes of about 0.5 microns with a spacing of about 10 microns. In FIG. 38, the metal component has hole sizes of about 1 micron with a spacing of about 5 microns. In FIG. 39, the metal component has hole sizes of about 1 micron with a spacing of about 10 microns. In FIG. 40, the metal component has hole sizes of about 1 micron with a spacing of about 20 microns. 0.5 micron holes are not visible in FIG. 39. 0.8 and 1 micron holes are formed. Hillocks are visible. There are no slots here. These figures show that small holes do not improve the hillock behavior of metals, thus indicating the comparative value of the slotting. These results can be compared to the hole patterns of devices A-H shown in FIG. 27. When FIGS. 37-40 are compared to FIG. 36, this shows the hole patterns on the same die and the same process are not as effective at eliminating hillocks as the narrow line patterns produced on the same die.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A substrate with a slotted metal, the slotted metal comprising a metal pattern comprising slots, wherein each of the slots separates metal material by a distance of less than or about equal to 2 microns, wherein the slots result in line widths that are approximately the size of a single metallurgical grain in an unpatterned layer;

wherein the slotted metal comprises a component selected from the group consisting of an actuator plate and a capacitive plate.

2. The substrate of claim 1 wherein the slotted metal is a component of a micro-electro-mechanical systems (MEMS) device.

3. The substrate of claim 2 wherein the slotted metal is a component of one of a movable structure and a stationary structure of the MEMS device.

4. The substrate of claim 2 wherein the MEMS device is a device selected from the group consisting of a tunable capacitor, a variable capacitor, and a switchable capacitor.

5. The substrate of claim 1 wherein the slots are between about 0.1 microns and 2 microns.

6. The substrate of claim 1 wherein the line widths are between about 0.1 microns and 2 microns.

7. The substrate of claim 1 wherein the slots comprise a shape selected from the group consisting of a substantially linear shape, a non-linear shape, a zig-zag shape, and a curvilinear shape.

8. The substrate of claim 1 wherein a dielectric/insulating layer is deposited on the metal.

9. The substrate of claim 8 wherein a second metal is deposited on the dielectric/insulating layer.

10. The substrate of claim 9 wherein the second metal is solid.

11. The substrate of claim 9 wherein the second metal is slotted.

12. The substrate of claim 11 wherein the slots of the second metal are one of substantially parallel and substantially perpendicular to the slots of the slotted metal.

13. The substrate of claim 11, wherein the second metal comprises a metal patterned with slots less than or about equal to 2 microns.

14. The substrate of claim 1 wherein the slotted metal is spaced from a movable structure of a MEMS device, and wherein the movable structure is attached to a second metal.

15. The substrate of claim 14 wherein the second metal comprises a metal selected from the group consisting of a solid metal and a slotted metal.

16. The substrate of claim 14 wherein the slotted metal and the second metal are capacitively coupled.

17. The substrate of claim 1 wherein the slotted metal is a first slotted metal, and wherein the first slotted metal is spaced from a second slotted metal.

18. The substrate of claim 17 wherein the slots of the first and second metals are one of substantially parallel and substantially perpendicular with respect to one another.

19. The substrate of claim 1 wherein the slots are substantially aligned in a predetermined direction of current flow.

20. The substrate of claim 19 wherein the applied current is one of DC, AC, and RF.

21. A method for forming a substrate with a slotted metal, the method comprising:
providing a substrate; and
attaching a slotted metal to the substrate, the slotted metal comprising a component selected from the group consisting of an actuator plate and a capacitive plate, and the slotted metal comprising a metal pattern comprising slots, wherein each of the slots separates metal material by a distance of less than or about equal to 2 microns, and wherein the slots result in line widths that are approximately the size of a single metallurgical grain in an unpatterned layer.

22. The method of claim 21 wherein the slotted metal is a component of a micro-electro-mechanical systems (MEMS) device.

23. The method of claim 21 wherein the slots are between about 0.1 microns and 2 microns.

24. The method of claim 21 wherein the line widths are between about 0.1 microns and 2 microns.

* * * * *